(12) United States Patent
Kim et al.

(10) Patent No.: US 12,557,268 B2
(45) Date of Patent: Feb. 17, 2026

(54) SEMICONDUCTOR DEVICE

(71) Applicant: SAMSUNG ELECTRONICS CO., LTD., Suwon-si (KR)

(72) Inventors: Yonghwan Kim, Hwaseong-si (KR); Yangdoo Kim, Seoul (KR); Sangwuk Park, Hwaseong-si (KR); Minkyu Suh, Yongin-si (KR); Sangho Lee, Hwaseong-si (KR); Jungpyo Hong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 640 days.

(21) Appl. No.: 17/874,691

(22) Filed: Jul. 27, 2022

(65) Prior Publication Data

US 2023/0200055 A1 Jun. 22, 2023

(30) Foreign Application Priority Data

Dec. 17, 2021 (KR) .......................... 10-2021-0181313

(51) Int. Cl.
*H10B 12/00* (2023.01)
*H10D 86/00* (2025.01)
*H10D 86/80* (2025.01)

(52) U.S. Cl.
CPC ......... *H10B 12/318* (2023.02); *H10B 12/033* (2023.02); *H10D 86/201* (2025.01); *H10D 86/80* (2025.01); *H10B 12/34* (2023.02)

(58) Field of Classification Search
CPC .... H10B 12/318; H10B 12/033; H10B 12/34; H10B 12/05; H10B 12/315; H10B 12/36;
(Continued)

(56) References Cited

U.S. PATENT DOCUMENTS 9,647,056 B2 * 5/2017 Yoon ..................... H10D 1/684
9,935,110 B2 * 4/2018 Rhie ................... H10B 12/315
(Continued)

FOREIGN PATENT DOCUMENTS

JP 2011061067 A 3/2011
KR 10-2014-0051688 A 5/2014
KR 1020200050699 A 5/2020

OTHER PUBLICATIONS

Office Action issued Nov. 23, 2023 for corresponding patent application TW 111147183.

*Primary Examiner* — Mohammed Shamsuzzaman
(74) *Attorney, Agent, or Firm* — Muir Patent Law, PLLC

(57) ABSTRACT

A semiconductor device including a substrate; storage node contacts on the substrate; lower electrode structures on the storage node contacts; a supporter structure on an external side surface of the lower electrode structures and connecting adjacent lower electrode structures to each other; a dielectric layer on the lower electrode structures and the supporter structure; and an upper electrode structure on the dielectric layer, wherein the lower electrode structures each include a pillar portion in contact with the storage node contacts; and a cylinder portion on the pillar portion, the pillar portion includes a first lower electrode layer having a cylindrical shape and having a lower surface and a side surface; and a first portion covering at least an internal wall of the first lower electrode layer, and the cylinder portion includes a second portion extending from the first portion and covering an upper end of the first lower electrode layer.

18 Claims, 21 Drawing Sheets

(58) Field of Classification Search
CPC ...... H10B 12/50; H10D 86/201; H10D 86/80; H10D 1/716
See application file for complete search history.

(56) References Cited

U.S. PATENT DOCUMENTS

| | | | |
|---|---|---|---|
| 10,971,496 B2* | 4/2021 | Kim | H10B 12/03 |
| 12,261,195 B2* | 3/2025 | Wu | H10D 1/714 |
| 2001/0026976 A1* | 10/2001 | Yang | H10D 1/711 |
| | | | 257/E21.018 |
| 2002/0028553 A1* | 3/2002 | Yokoyama | H10D 1/716 |
| | | | 257/E27.088 |
| 2009/0268370 A1* | 10/2009 | Kim | H10B 12/033 |
| | | | 361/303 |
| 2012/0193761 A1* | 8/2012 | Park | H10D 1/042 |
| | | | 257/532 |
| 2014/0002976 A1* | 1/2014 | Brain | H10B 12/033 |
| | | | 257/532 |
| 2014/0110824 A1* | 4/2014 | Park | H01L 21/31116 |
| | | | 257/532 |
| 2016/0365409 A1* | 12/2016 | Lee | H10D 1/716 |
| 2017/0141117 A1* | 5/2017 | Rhie | H10D 1/042 |
| 2018/0175044 A1* | 6/2018 | Rhie | H10B 12/00 |
| 2020/0144269 A1* | 5/2020 | Kim | H10D 1/711 |
| 2021/0359100 A1* | 11/2021 | Maeng | H10B 51/00 |
| 2021/0375625 A1* | 12/2021 | Cho | H01L 21/0332 |
| 2023/0309292 A1* | 9/2023 | Ahn | H10B 12/0335 |

\* cited by examiner

SEMICONDUCTOR DEVICE

CROSS-REFERENCE TO RELATED APPLICATION

This application claims benefit of priority to Korean Patent Application No. 10-2021-0181313 filed on Dec. 17, 2021, in the Korean Intellectual Property Office, the disclosure of which is incorporated herein by reference in its entirety.

BACKGROUND

1. Field

Embodiments relate to a semiconductor device.

2. Description of the Related Art

As highly integrated and miniaturized semiconductor devices are in demand, capacitors of the semiconductor devices also have been miniaturized.

SUMMARY

The embodiments may be realized by providing a semiconductor device including a substrate; storage node contacts on the substrate; lower electrode structures on the storage node contacts; a supporter structure on at least a portion of an external side surface of the lower electrode structures and connecting adjacent lower electrode structures to each other; a dielectric layer on the lower electrode structures and the supporter structure; and an upper electrode structure on the dielectric layer, wherein each of the lower electrode structures includes a pillar portion in contact with each of the storage node contacts; and a cylinder portion on the pillar portion, the pillar portion includes a first lower electrode layer having a cylindrical shape and having a lower surface and a side surface; and a first portion covering at least an internal wall of the first lower electrode layer, and the cylinder portion includes a second portion extending from the first portion and covering an upper end of the first lower electrode layer.

The embodiments may be realized by providing a semiconductor device including a lower electrode structure including a pillar portion and a cylinder portion on the pillar portion and extending from the pillar portion; a dielectric layer on the lower electrode structure; and an upper electrode structure on the dielectric layer, wherein the pillar portion includes a first lower electrode layer and a second lower electrode layer on the first lower electrode layer.

The embodiments may be realized by providing a semiconductor device including a substrate; storage node contacts on the substrate; and capacitors respectively on the storage node contacts, wherein each of the capacitors includes lower electrode structures including a pillar portion and a cylinder portion on the pillar portion; a dielectric layer on the lower electrode structures; and an upper electrode structure on the dielectric layer, and the pillar portion includes a first lower electrode layer and a second lower electrode layer on the first lower electrode layer.

BRIEF DESCRIPTION OF THE DRAWINGS

Features will be apparent to those of skill in the art by describing in detail exemplary embodiments with reference to the attached drawings in which.

DETAILED DESCRIPTION

In addition, terms, such as "upper", "middle", "lower" and the like, are used to distinguish between relative positions of components, but example embodiments are not limited by these terms. Accordingly, the terms, such as "upper", "middle", "lower" and the like, could be termed "first", "second", "third" and the like, and used to describe components of the specification. However, the components are not limited by the terms, and "first component" may be referred to as "second component." For example, as used herein, the terms "first," "second," and the like are merely for identification and differentiation, and are not intended to imply or require sequential inclusion (e.g., a third element and a fourth element may be described without implying or requiring the presence of a first element or second element).

Hereinafter, a semiconductor device according to example embodiments will be described with reference to FIGS. 1 and 2.

Figure 1:
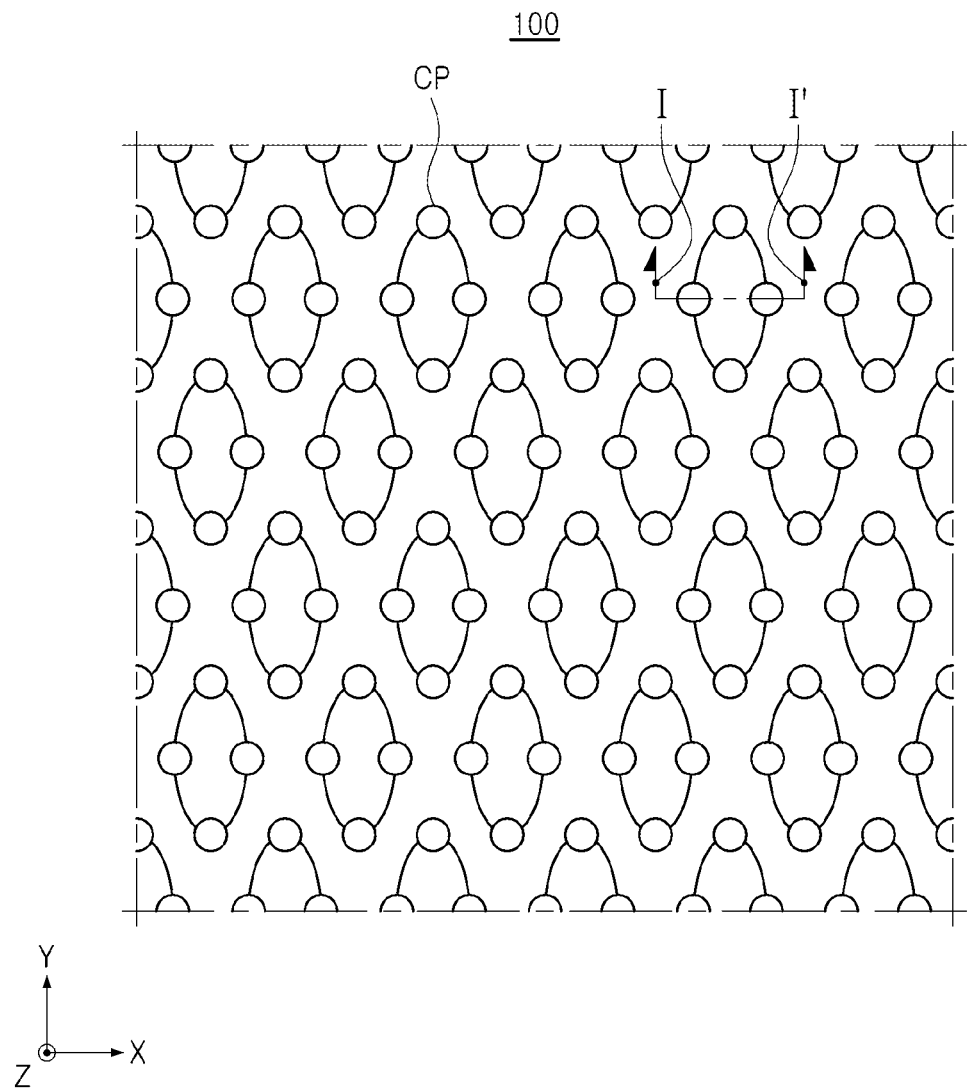
FIG. 1 is a schematic layout diagram of a semiconductor device according to example embodiments.
Figure 2:
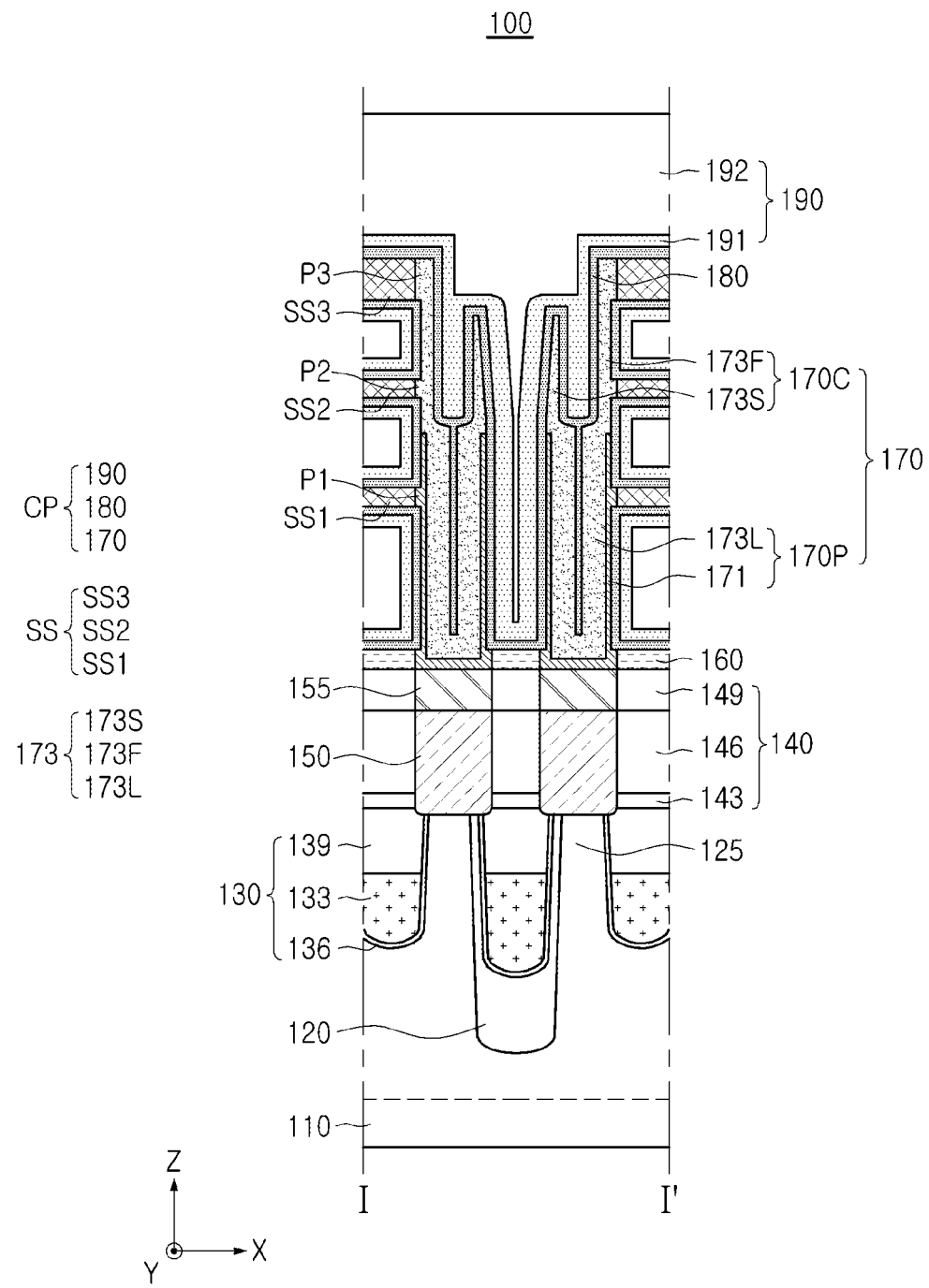
FIG. 2 is a schematic cross-sectional view of a semiconductor device according to example embodiments.

FIG. 1 is a schematic layout diagram of a semiconductor device 100 according to example embodiments, and FIG. 2 is a schematic cross-sectional view of the semiconductor device 100 according to example embodiments. FIG. 2 is a cross-sectional view taken along line I-I' of FIG. 1.

Referring to FIGS. 1 and 2, the semiconductor device 100 may include a substrate 110, a storage node contact 150 on the substrate 110, and a capacitor CP in contact with the storage node contact 150. The semiconductor device 100 may further include a landing pad 155 between the storage node contact 150 and the capacitor CP.

The substrate 110 may include a semiconductor material, e.g., a group IV semiconductor, a group III-V compound semiconductor, or a group II-VI compound semiconductor. In an implementation, the group IV semiconductor may include silicon, germanium, or silicon-germanium. The substrate 110 may further include impurities. The substrate 110 may include, e.g., a silicon substrate, a silicon-on-insulator (SOI) substrate, a germanium substrate, a germanium-on-insulator (GOI) substrate, a silicon-germanium substrate, or a substrate including an epitaxial layer. As used herein, the term "or" is not an exclusive term, e.g., "A or B" would include A, B, or A and B.

The substrate 110 may include a device isolation region 120 and active regions 125 defined by the device isolation region 120.

The active regions 125 may have a bar shape, and may be disposed in an island shape extending in one direction within the substrate 110. In an implementation, the active regions 125 may be inclined at a predetermined angle with respect to an X-direction and a Y-direction, and may include a plurality of active regions repeatedly arranged at regular intervals. Due to the inclined arrangement of the active regions 125, cell density per unit area of the substrate 110 may be increased while securing a separation distance between neighboring active regions 125.

The active regions 125 may have first and second impurity regions having a predetermined depth from an upper surface of the substrate 110. The first and second impurity regions may be spaced apart from each other. The first and second impurity regions may be provided as source/drain regions of a transistor formed by a wordline (a gate electrode layer 133). In an implementation, depths of the first and second impurity regions in a source region and a drain region may be different from each other.

The device isolation region 120 may be formed by a shallow trench isolation (STI) process. The device isolation region 120 may electrically isolate the active regions from each other while surrounding the active regions 125. The device isolation region 120 may be formed of an insulating material, e.g., a silicon oxide, a silicon nitride, or a combination thereof. The device isolation region 120 may include a plurality of regions having bottom depths, different depending on a width of a trench in which the substrate 110 has been etched. The device isolation region 120 may define active regions 125.

The substrate 110 may further include a buried gate structure 130 buried in the substrate 110 to extend in a first direction (a Y-direction).

The buried gate structure 130 may include a gate electrode layer 133, a gate dielectric layer 136, and a gate capping layer 139. The gate electrode layer 133 may be provided in a line shape extending in the first direction (the Y-direction) to constitute a wordline. The wordline may cross the active region 125 and extend (e.g., lengthwise) in the first direction (the Y-direction). In an implementation, a pair of adjacent wordlines may cross one active region 125.

An upper surface of the gate electrode layer 133 may be on a level that is lower than a level of an upper surface of the substrate 110. High and low of the term "level" used herein may be defined based on a substantially planar upper surface. In an implementation, the gate electrode layer 133 may constitute a gate of a buried channel array transistor (BCAT). In an implementation, the gate electrode layer 133 may have a shape on the substrate 110.

The gate electrode layer 133 may include a conductive material, e.g., polycrystalline silicon (Si), titanium (Ti), titanium nitride (TiN), tantalum (Ta), tantalum nitride (TaN), tungsten (W), tungsten nitride (WN), or aluminum (Al). In an implementation, the gate electrode layer 133 may have a double-layer structure in which two layers are formed of different materials.

The gate dielectric layer 136 may conformally cover a side surface and a bottom surface of the gate electrode layer 133. The gate dielectric layer 136 may include, e.g., a silicon oxide, a silicon nitride, or a silicon oxynitride.

The gate capping layer 139 may be on the gate electrode layer 133. The gate capping layer 139 may include an insulating material, e.g., a silicon nitride.

The semiconductor device 100 may further include an interlayer insulating layer 140 on the substrate 110. The interlayer insulating layer 140 may include a plurality of interlayer insulating layers. The interlayer insulating layer 140 may include, e.g., first to third interlayer insulating layers 143, 146, and 149. Each of the first to third interlayer insulating layers 143, 146, and 149 may include an insulating material. In an implementation, the first to third interlayer insulating layers 143, 146, and 149 may include, e.g., a silicon oxide, a silicon nitride, or a silicon oxynitride.

The storage node contact 150 may be on the substrate 110. The storage node contact 150 may be formed through at least a portion of the interlayer insulating layer 140. In an implementation, the storage node contact 150 may extend through the first and second interlayer insulating layers 143 and 146.

The storage node contact 150 may be connected to one region of the active region 125. The storage node contact 150 may be between wordlines (gate electrode layers 133). A lower surface of the storage node contact 150 may be on or at a level that is lower than a level of an upper surface of the substrate 110. The storage node contact 150 may include a conductive material. In an implementation, the storage node contact 150 may be formed of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof.

The semiconductor device 100 may further include a landing pad 155 between the storage node contact 150 and the capacitor CP. The landing pad 155 may electrically connect the storage node contact 150 and the lower electrode structure 170 of the capacitor CP to each other. The landing pad 155 may be on the storage node contact 150 and may penetrate through at least a portion of the interlayer insulating layer 140. In an implementation, the landing pad 155 may penetrate through the third interlayer insulating layer 149. The landing pad 155 may include a conductive material, e.g., polycrystalline silicon (Si), titanium (Ti), titanium nitride (TiN), tantalum (Ta), tantalum nitride (TaN), tungsten (W), or tungsten nitride (WN).

The semiconductor device 100 may further include an etch-stop layer 160 on the interlayer insulating layer 140. The lower electrode structure 170 of the capacitor CP may penetrate through the etch-stop layer 160 to be in contact with the landing pad 155. The etch-stop layer 160 may include an insulating material having etch selectivity with respect to molding layers (ML1, ML2, and ML3 of FIG. 6A) under a specific etching condition. In an implementation, when the molding layers (ML1, ML2, ML3 of FIG. 6A) include a silicon oxide, the etch-stop layer 160 may include, e.g., a silicon nitride (SiN) or a silicon carbonitride (SiCN).

The capacitor CP may include a lower electrode structure 170, a dielectric layer 180, and an upper electrode structure 190. A supporter structure SS may be on a side surface of the lower electrode structure 170 of the capacitor CP.

The lower electrode structure 170 may be in contact with the landing pad 155 through the etch-stop layer 160.

The lower electrode structure 170 may include a first lower electrode layer 171 and a second lower electrode layer 173 on the first lower electrode layer 171. In an implementation, the first and second lower electrode layers 171 and 173 may each include, e.g., polycrystalline silicon (Si), titanium (Ti), titanium nitride (TiN), tantalum (Ta), tantalum nitride (TaN), tungsten (W), tungsten nitride (WN), or aluminum (Al).

The first lower electrode layer 171 may have a cylindrical shape having a lower surface and side surfaces. The second lower electrode layer 173 may include a first portion 173L, covering at least an internal wall of the first lower electrode layer 171, and a second portion extending from the first portion 173L and covering an upper end of the first lower electrode layer 171. The second portion may include a first sidewall portion 173F and a second sidewall portion 173S. The first portion 173L may fill a portion or an entirety of an empty space defined by the cylindrical shape of the first lower electrode layer 171. The first sidewall portion 173F and the second sidewall portion 173S may extend from the first portion 173L to cover the upper end of the first lower electrode layer 171. The second portion may include a side surface aligned with at least a portion of the side surface of the first lower electrode layer 171.

The lower electrode structure 170 may include a pillar portion 170P and a cylinder portion 170C on the pillar portion 170P. The first lower electrode layer 171 and the first portion 173L of the second lower electrode layer 173 may constitute a pillar portion 170P. The first and second sidewall portions 173F and 173S of the second lower electrode layer 173 may constitute a cylinder portion 170C.

In an implementation, the pillar portion 170P may extend to a level between the first supporter layer SS1 and the second supporter layer SS2. The first sidewall portion 173F may extend from the first portion 173L, e.g., to a level of an upper surface of the third supporter layer SS3. The second sidewall portion 173S may extend from the first portion 173L to a level that is lower than a level of the first sidewall portion 173F. In an implementation, the second sidewall portion 173S may extend to a level that is lower than or equal to a level of a lower surface of the third supporter layer SS3.

In an implementation, the first lower electrode structure 170 may include projections P1, P2, and P3 protruding (e.g., outwardly) toward the supporter structure SS. The first projection P1 may protrude from the first lower electrode layer 171 toward the first supporter layer SS1. The second projection P2 may protrude from the first sidewall portion 173F toward the second supporter layer SS2. The third projection P3 may protrude from the first sidewall portion 173F toward the third supporter layer SS3.

In an implementation, the second sidewall portion 173S may have a shape of which width is decreased in a direction toward an upper portion. In an implementation, one side surface of the second sidewall portion 173S may be perpendicular to the substrate 110, and the other side surface thereof may have a shape inclined toward the one side surface. A ratio of the pillar portion 170P to the cylinder portion 170C, the shape of the cylinder portion 170C, the shape of the supporter structure SS, and the like, may vary according to example embodiments.

As described above, the capacitor CP according to example embodiments may include the pillar portion 170P at a lower portion thereof, and the cylinder portion 170C at an upper portion thereof. The capacitor CP may include the pillar portion 170P to help uniformly adsorb the dielectric layer 180, and may include the cylinder portion 170C to help secure capacitance for a semiconductor device. Electrical characteristics of the capacitor CP according to example embodiments may be improved.

The semiconductor device 100 may include a plurality of capacitors CP. Each of the capacitors CP may include first and second lower electrode layers 171 and 173 having the same height. Also, each of the capacitors CP may include a pillar portion 170P and a cylinder portion 170C having the same height. Accordingly, each of the capacitors CP may have constant capacitance.

The supporter structure SS may be on a side surface of the lower electrode structure 170. In an implementation, the supporter structure SS may include a plurality of supporter layers, e.g., first to third supporter layers SS1, SS2, and SS3. The first to third supporter layers SS1, SS2, and SS3 may be spaced apart from each other in a Z direction, perpendicular to the upper surface of the substrate 110, and may extend in a horizontal direction, perpendicular to the Z direction.

The first to third supporter layers SS1, SS2, and SS3 may be in contact with the plurality of lower electrode structures 170, and may connect a plurality of adjacent lower electrode structures 170 to each other. In an implementation, the first supporter layer SS1 may be in contact with an external surface of the pillar portion 170P, and the second and third supporter layers SS2 and SS3 may be in contact with an external surface of the cylinder portion 170C. In an implementation, the first supporter layer SS1 may be in contact with the first lower electrode layer 171 of the pillar portion 170P, and the second supporter layer SS2 may be in contact with the first sidewall portion 173F of the cylinder portion 170C.

The first to third supporter layers SS1, SS2, and SS3 may be a structure supporting a plurality of lower electrode structures 170 having a high aspect ratio. The first to third supporter layers SS1, SS2, and SS3 may include, e.g., a silicon oxide, a silicon nitride, or a silicon oxynitride.

In an implementation, the first and second supporter layers SS1 and SS2 may have a thickness (e.g., in the vertical Z direction) that is smaller than a thickness of the third supporter layer SS3. A distance (in the Z direction) between an upper surface of the interlayer insulating layer 140 and a lower surface of the first supporter layer SS1 may be greater than a distance (in the Z direction) between an upper surface of the first supporter layer SS1 and a lower surface of the second supporter layer SS2. The distance (in the Z direction) between the upper surface of the first supporter layer SS1 and the lower surface of the second supporter layer SS2 may be greater than a distance (in the Z direction) between an upper surface of the second supporter layer SS2 and a lower surface of the third supporter layer SS3.

The dielectric layer 180 may be on the etch-stop layer 160 and may cover the lower electrode structure 170 and the supporter structure SS. The dielectric layer 180 may conformally cover upper surfaces and side surfaces of the plurality of lower electrode structures 170, an upper surface of the etch-stop layer 160, and exposed surfaces of the supporter structure SS. In an implementation, the dielectric layer 180 may include a portion extending inwardly or in the pillar portion 170P of the lower electrode structure 170.

The dielectric layer 180 may include, e.g., a high-k dielectric material, a silicon oxide, a silicon nitride, or combinations thereof. In an implementation, the dielectric layer 180 may include, e.g., an oxide, a nitride, a silicide, an oxynitride, or a silicic acid including hafnium (Hf), aluminum (Al), zirconium (Zr), or lanthanum (La).

The upper electrode structure 190 may be a structure covering the plurality of lower electrode structures 170, the supporter structure SS, and the dielectric layer 180. The upper electrode structure 190 may be a structure filling a space between the plurality of lower electrode structures 170 and a space between the supporter structures SS.

The upper electrode structure 190 may include a single upper electrode layer or a plurality of upper electrode layers. In an implementation, the upper electrode structure 190 may include a first upper electrode layer 191 and a second upper electrode layer 192 sequentially on the lower electrode structure 170.

The first upper electrode layer 191 may be a conductive layer conformally covering the dielectric layer 180. The first upper electrode layer 191 may include a metal-containing material, e.g., a titanium nitride (TiN).

The second upper electrode layer 192 may fill the space between the plurality of lower electrode structures 170 and the space between the supporter structures SS while covering the first upper electrode layer 191. The second upper electrode layer 192 may include a semiconductor material, e.g., polycrystalline silicon (Si) containing impurities.

Figure 3:
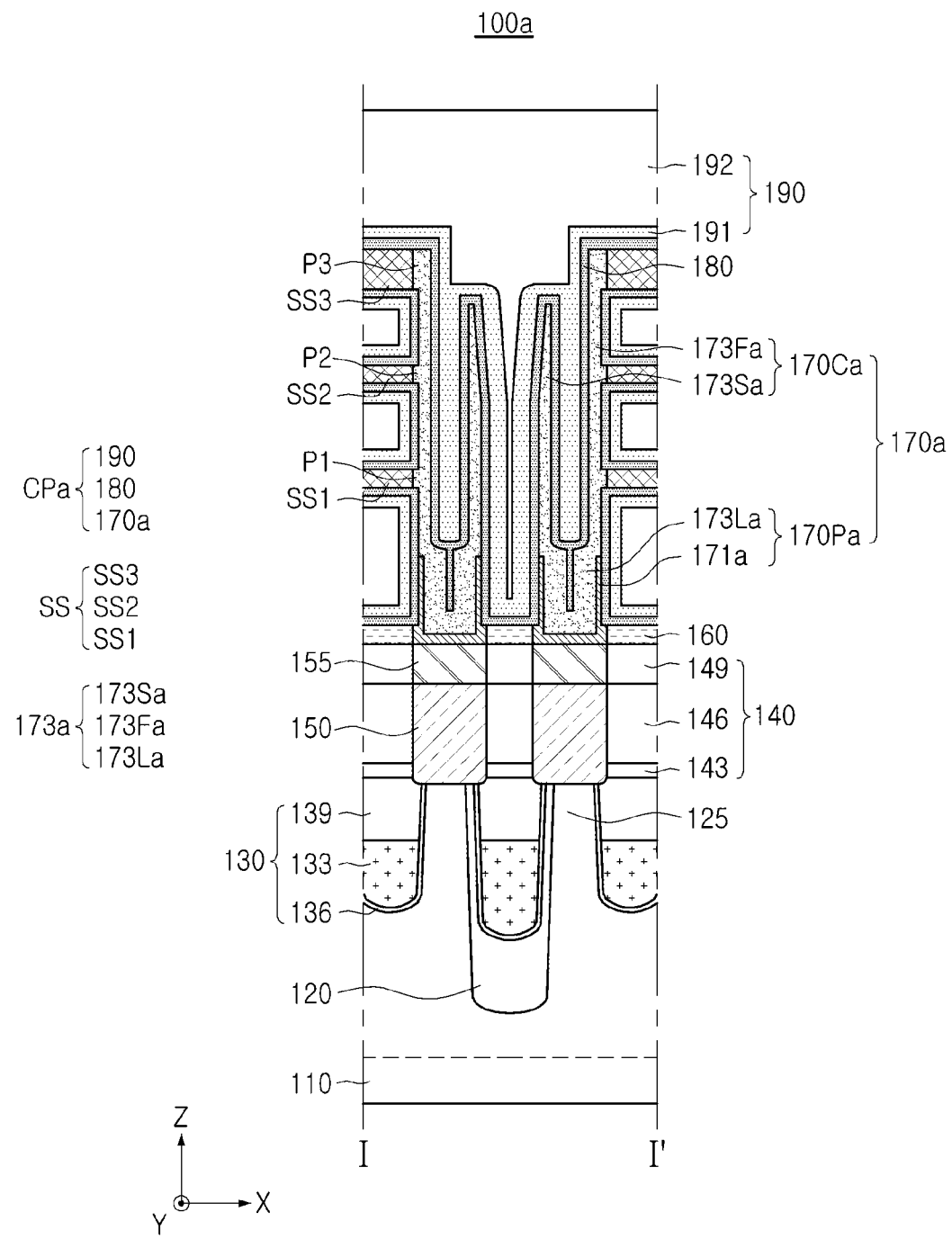
FIG. 3 is a schematic cross-sectional view of a semiconductor device according to example embodiments.
Figure 4:
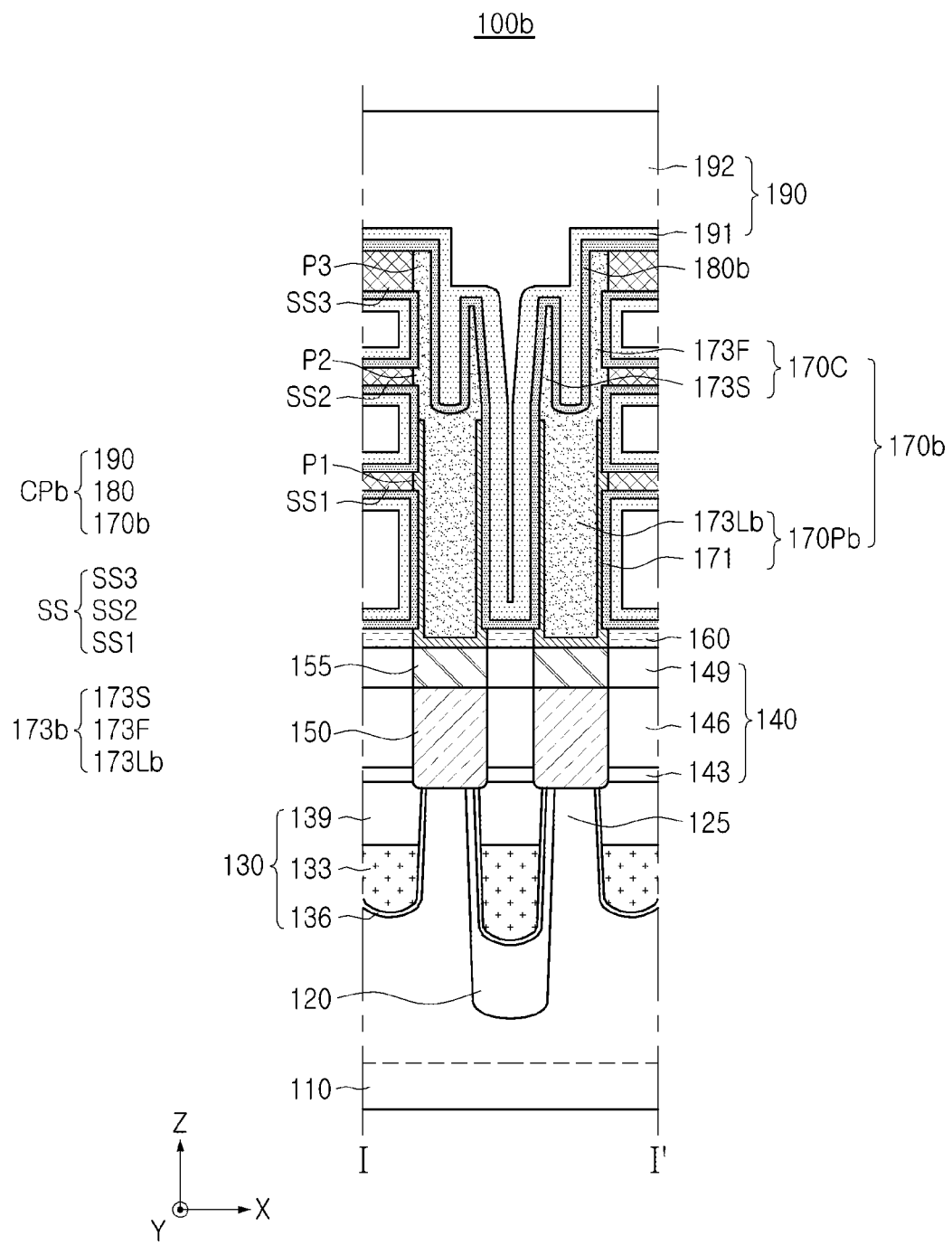
FIG. 4 is a schematic cross-sectional view of a semiconductor device according to example embodiments.
Figure 5:
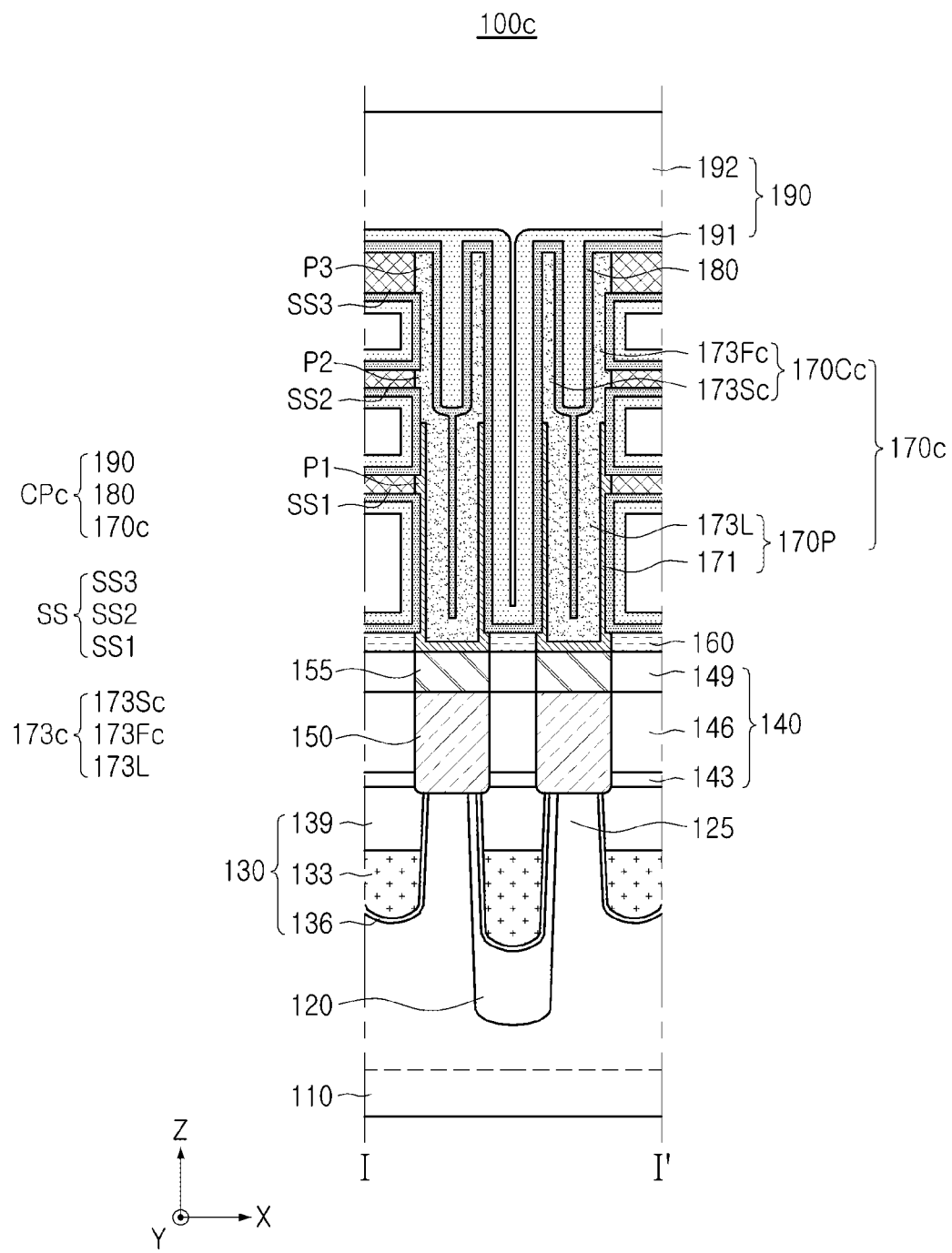
FIG. 5 is a schematic cross-sectional view of a semiconductor device according to example embodiments.

FIGS. 3 to 5 are schematic cross-sectional views of semiconductor devices according to example embodiments.

The example embodiments of FIGS. 3 to 5 are different from the previous embodiments of FIGS. 1 and 2 in shape, structure, or the like, of a capacitor. In the example embodiments of FIGS. 3 to 5, the same reference numerals as those of FIGS. 1 and 2 but different alphabets are used to describe example embodiments, different from the example embodiment of FIGS. 1 and 2. Features described with the same reference numerals described above may be the same or similar.

The semiconductor device 100a of FIG. 3 is different from the semiconductor device 100 according to the example embodiment of FIGS. 1 and 2, in a (e.g., height) ratio of a pillar portion 170Pa and a cylinder portion 170Ca of a capacitor CPa.

Referring to FIG. 3, the pillar portion 170Pa may extend only to a level between an etch-stop layer 160 and a first supporter layer SS1. The cylinder portion 170Ca may be on the pillar portion 170Pa. The cylinder portion 170Ca may extend from the level between the etch-stop layer 160 and the first supporter layer SS1 to a level of an upper surface of a third supporter layer SS3. The cylinder portion 170Ca may have a height in the Z direction that is greater than a height of the pillar portion 170Pa.

In the cylinder portion 170Ca, a dielectric layer 180 may be on internal surfaces and external surfaces of the first and second sidewall portions 173Fa and 173Sa. The dielectric layer 180 may be on an external surface of the pillar portion 170Pa. As a ratio of the height of the cylinder portion 170Ca to a total height of the capacitor CPa is increased, capacitance of the capacitor CPa may be increased. The capacitor CPa illustrated in FIG. 3 may have capacitance that is higher than the capacitance of the capacitor CP illustrated in FIGS. 1 and 2.

In an implementation, the ratio of the height of the cylinder portion 170Ca to the total height of the capacitor CPa may vary depending on capacitance of a product, a size and a shape of a capacitor, a thickness of a dielectric layer, or the like.

The semiconductor device 100b of FIG. 4 is different from the semiconductor device 100 according to the example embodiment of FIGS. 1 and 2, in shapes of a pillar portion 170Pb and a dielectric layer 180b.

Referring to FIG. 4, the pillar portion 170Pb may not include a seam therein. The dielectric layer 180b may be conformally on an upper surface and side surfaces of a lower electrode structure 170b. The dielectric layer 180b may be on an upper surface of the pillar portion 170Pb of the lower electrode structure 170b, and may not extend inwardly or inside of the pillar portion 170Pb. The shape of the pillar portion 170Pb and the dielectric layer 180b may vary depending on sizes of the capacitors CPb and a gap therebetween, thicknesses and materials of the first and second lower electrode layers 171 and 173b, and the like.

The semiconductor device 100c of FIG. 5 is different from the semiconductor device 100 according to the example embodiment of FIGS. 1 and 2, in a shape of a cylinder portion 170Cc.

Referring to FIG. 5, first and second sidewalls 173Fc and 173Sc of the cylinder portion 170Cc may have the same shape. The first and second sidewalls 173Fc and 173Sc may extend to a level of an upper surface of the third supporter layer SS3. In an implementation, the first and second sidewalls 173Fc and 173Sc may have a uniform width throughout an entire height thereof. In an implementation, the shapes of the first and second sidewalls 173Fc and 173Sc may vary depending on a method of etching molding layers (ML1, ML2, ML3 of FIG. 6A, and the like) and preliminary supporter layers (SL1, SL2, SL3 of FIG. 6A, and the like) during a fabrication process.

Figure 6A:
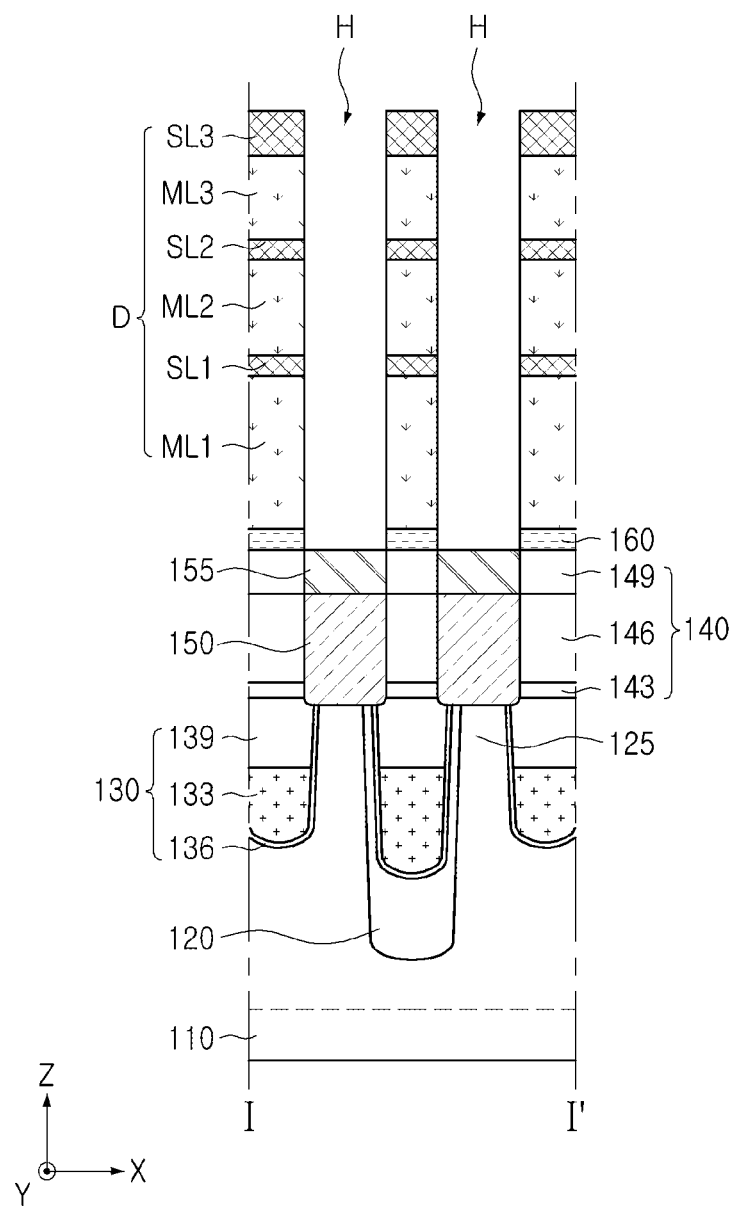
FIGS. 6A to 6N are schematic cross-sectional views of stages in a method of fabricating a semiconductor device according to example embodiments.
Figure 6B:
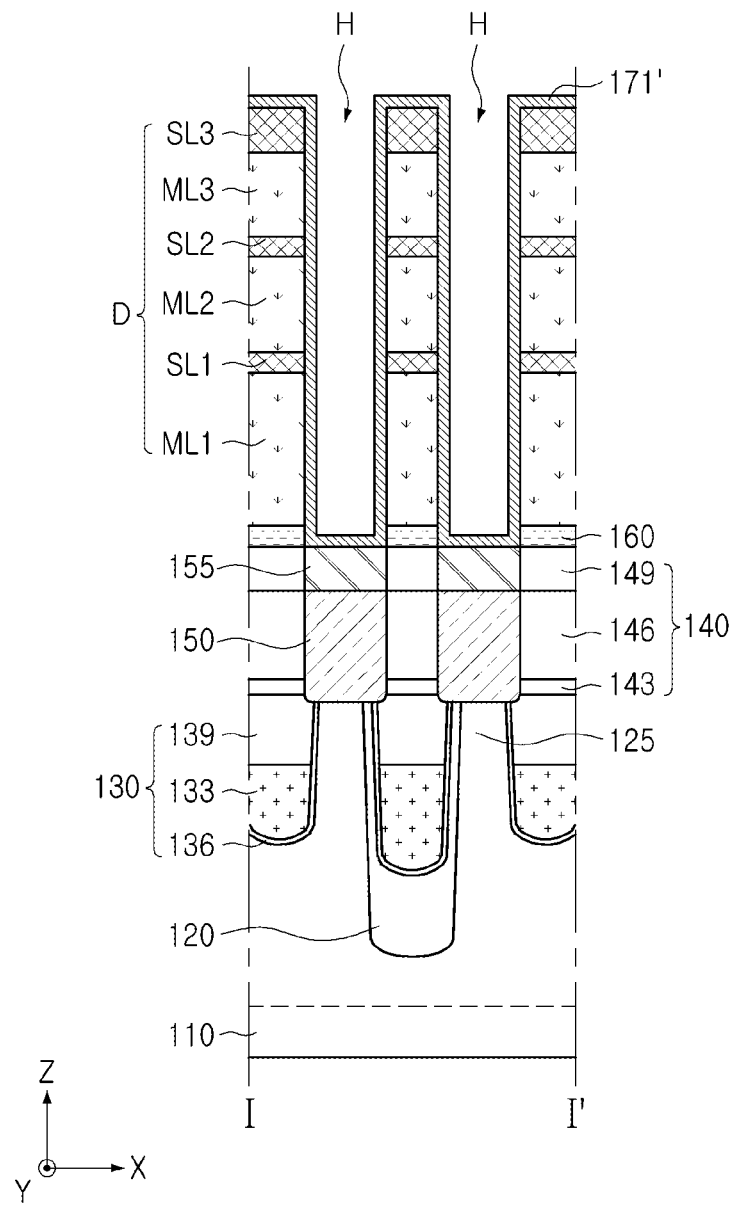
Figure 6C:
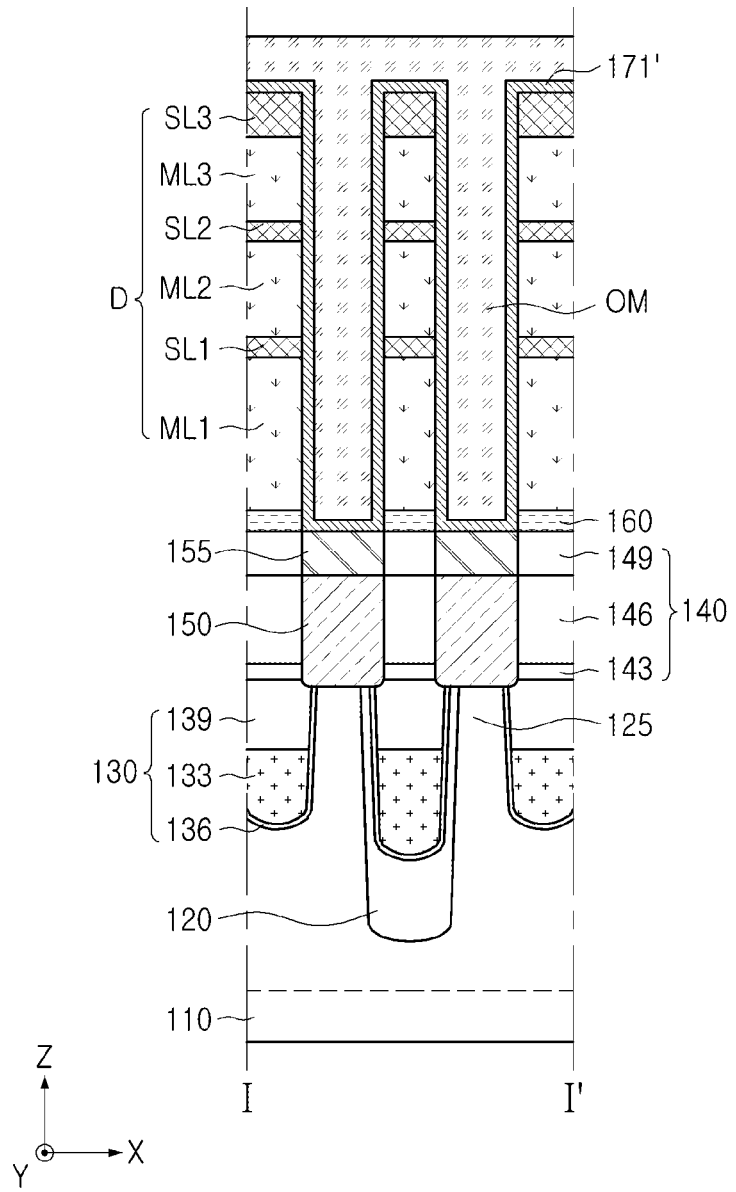
Figure 6D:
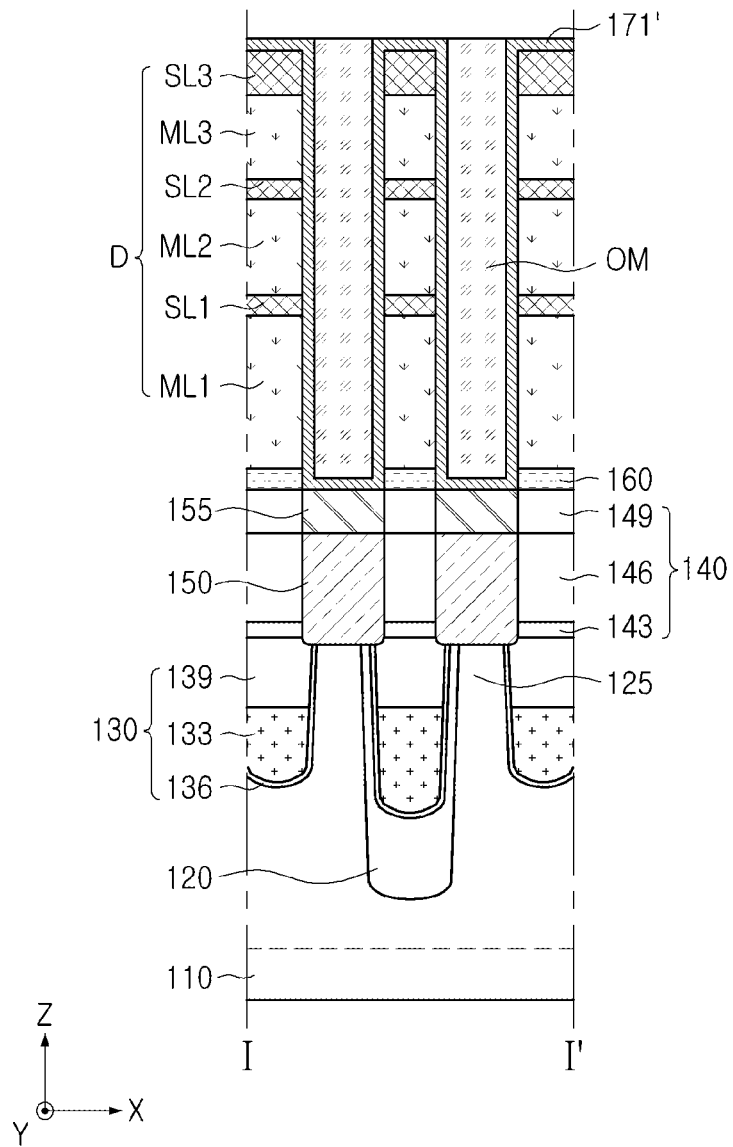
Figure 6E:
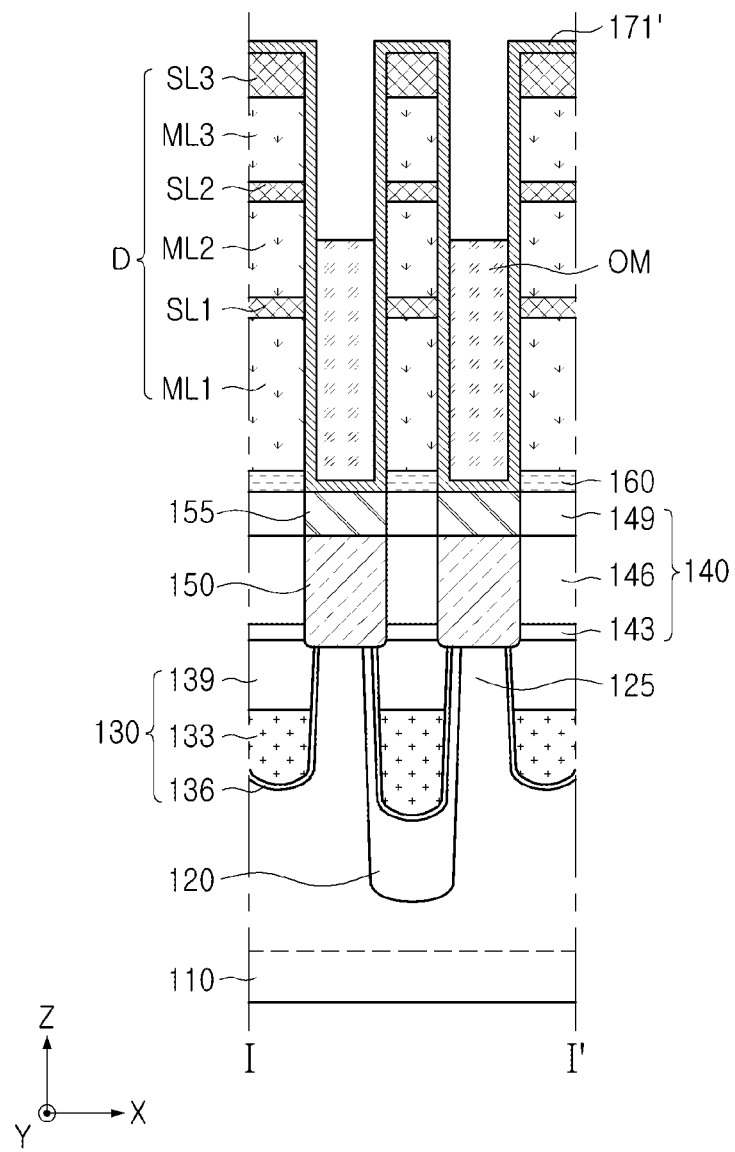
Figure 6F:
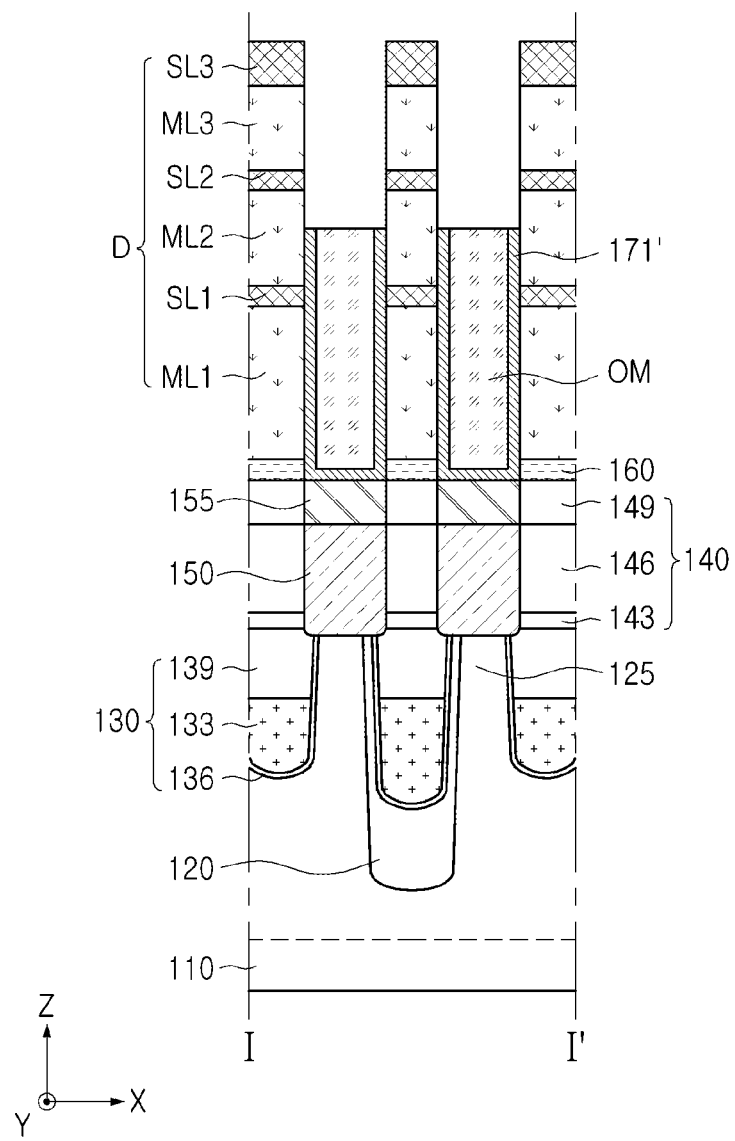
Figure 6G:
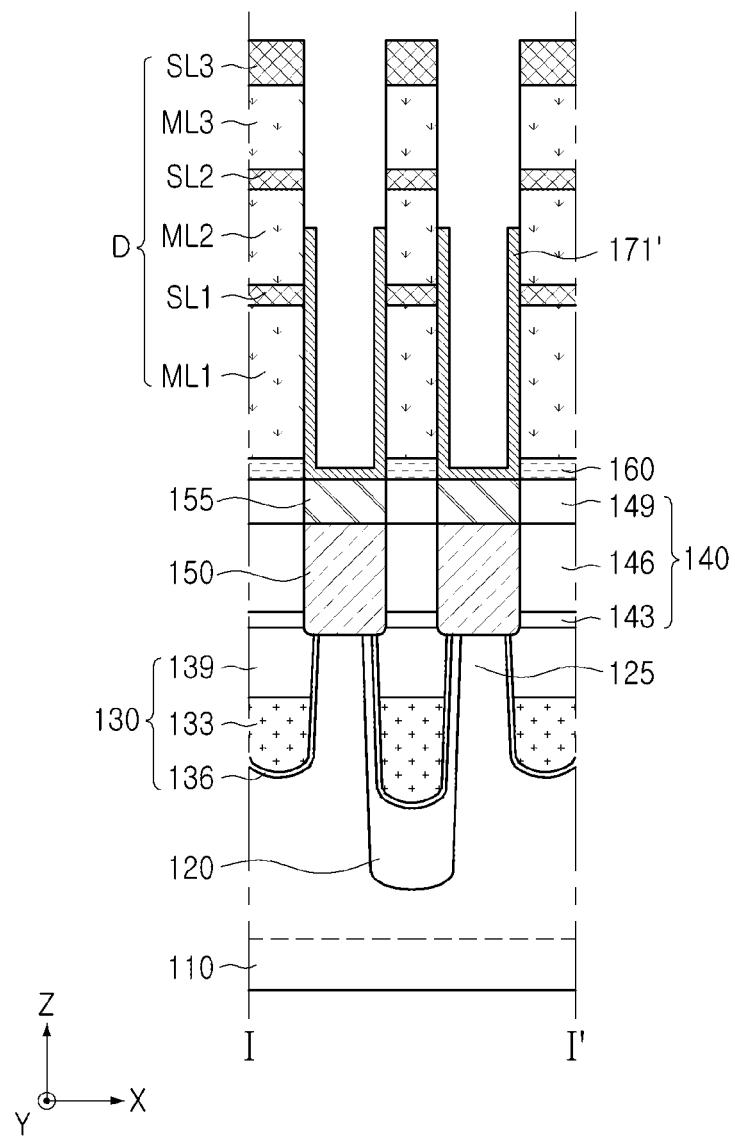
Figure 6H:
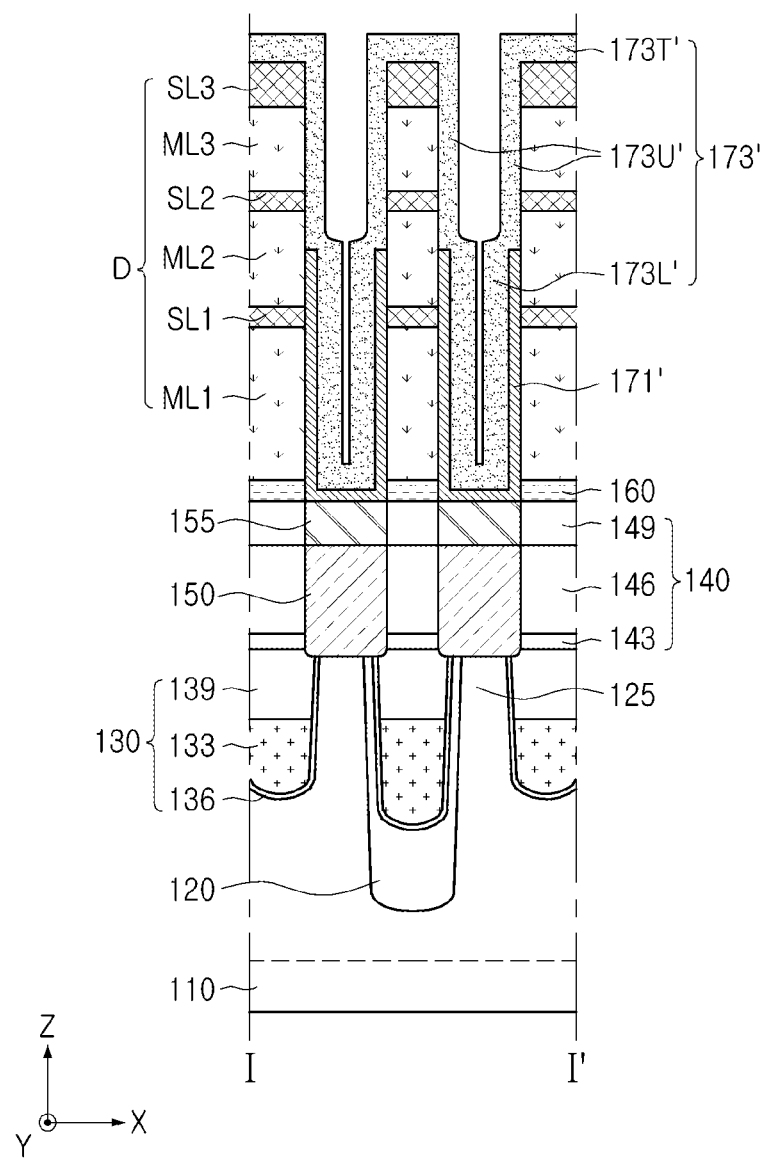
Figure 6I:
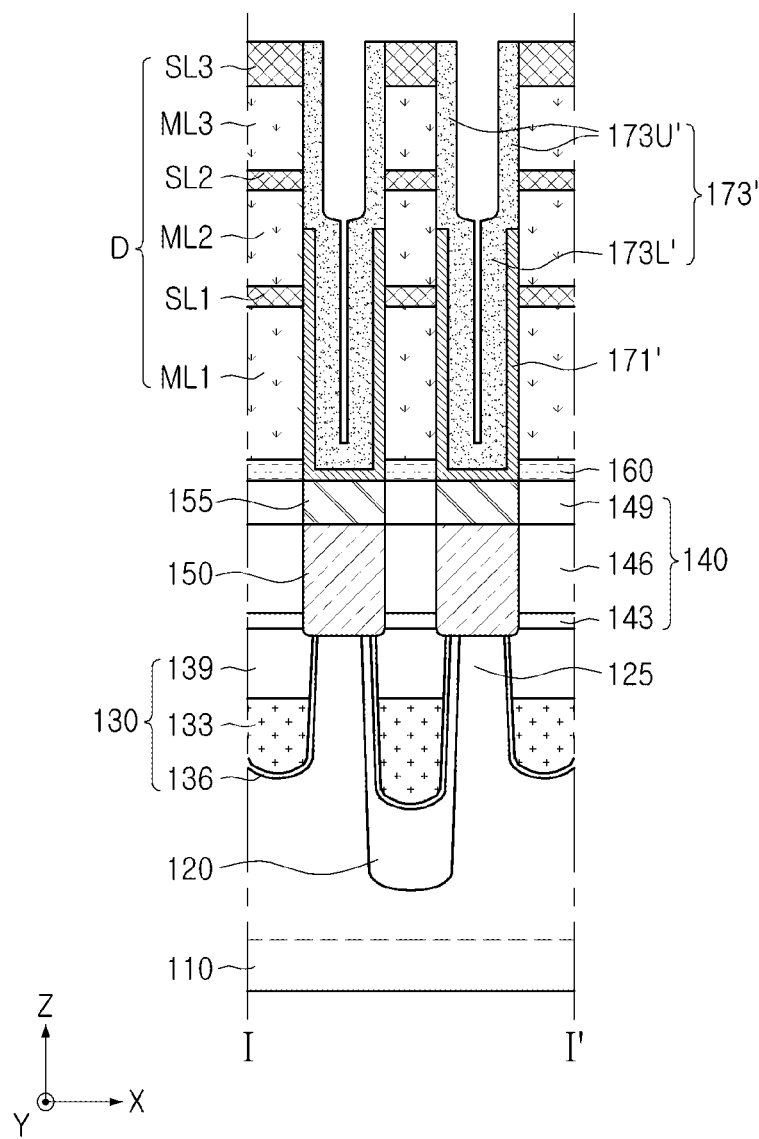
Figure 6J:
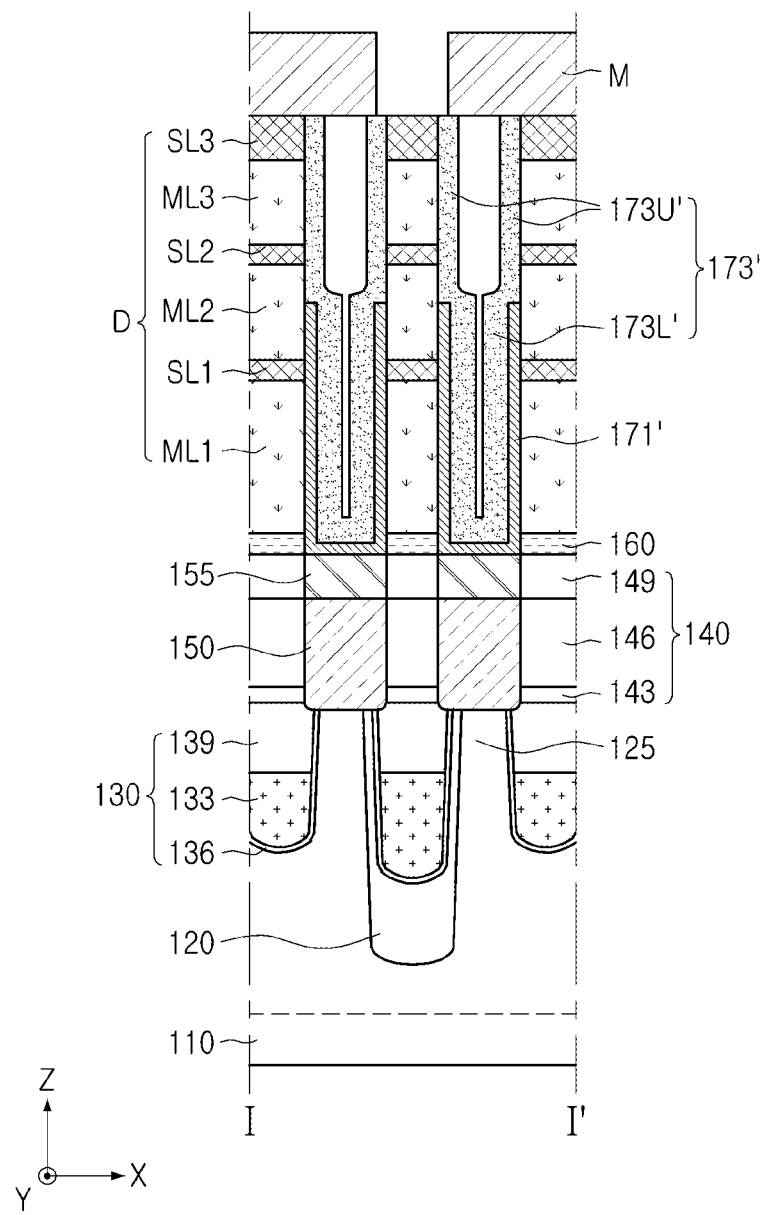
Figure 6K:
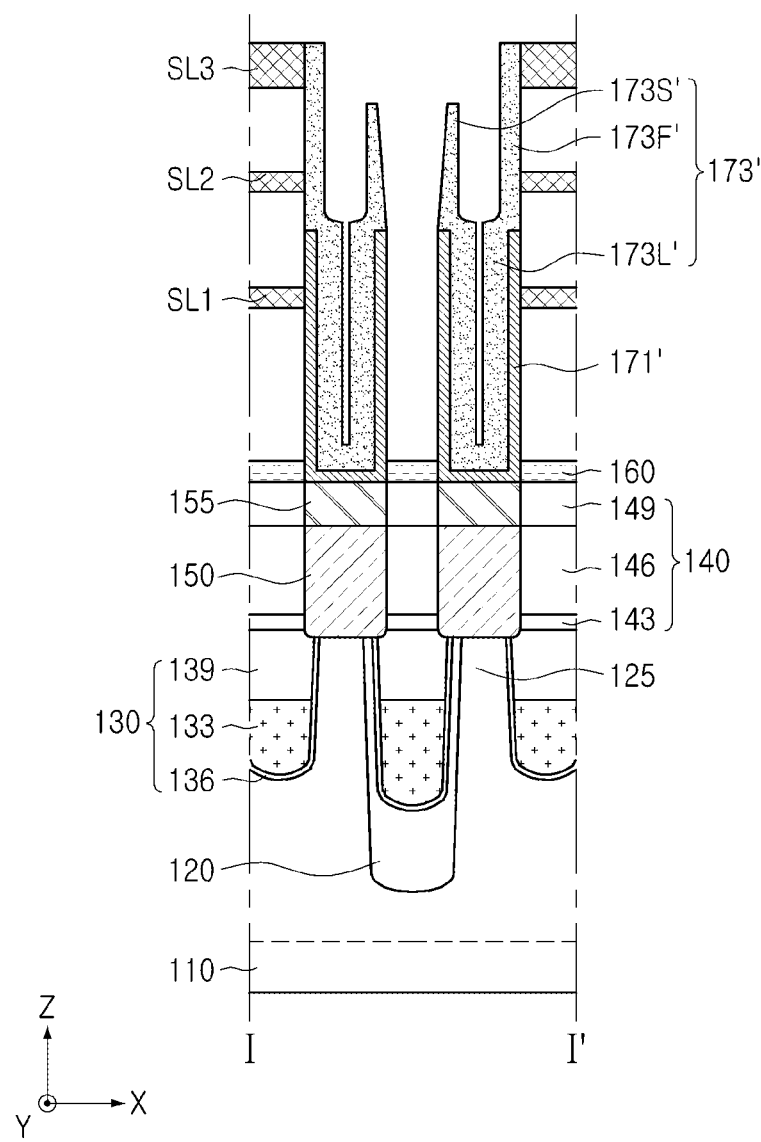
Figure 6L:
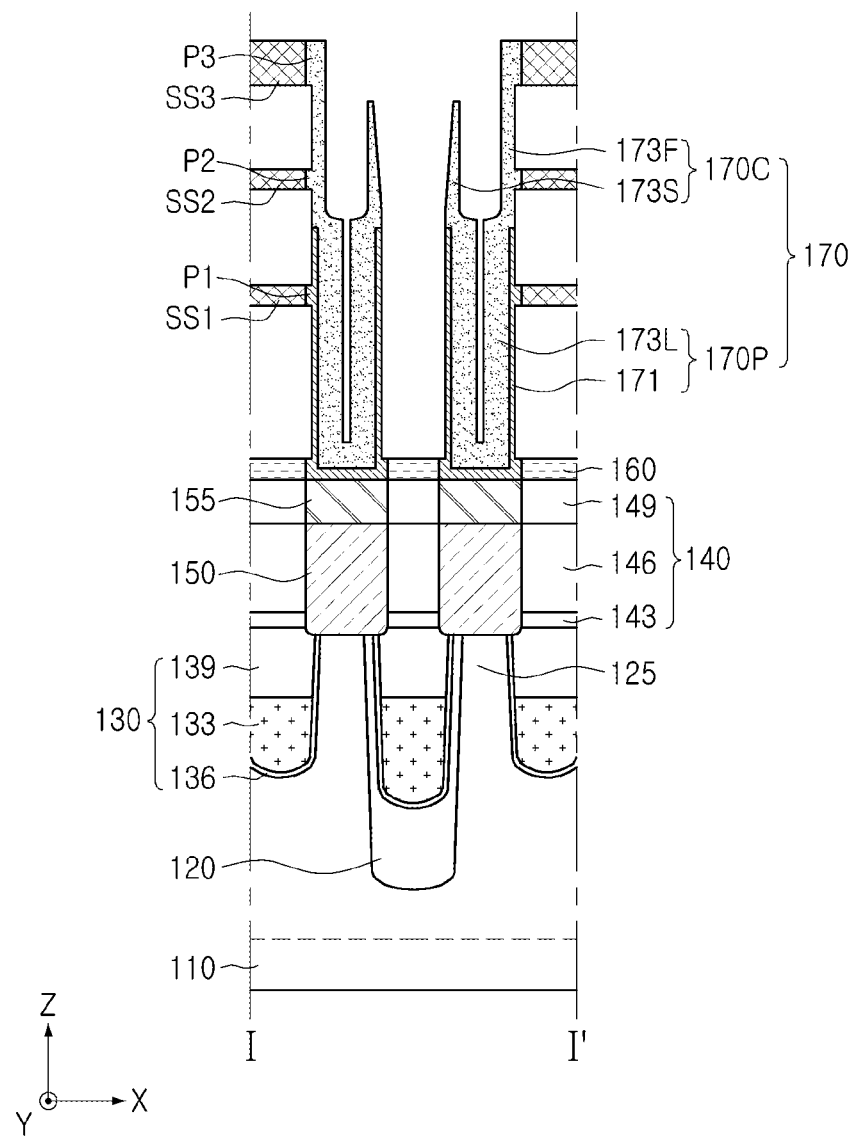
Figure 6M:
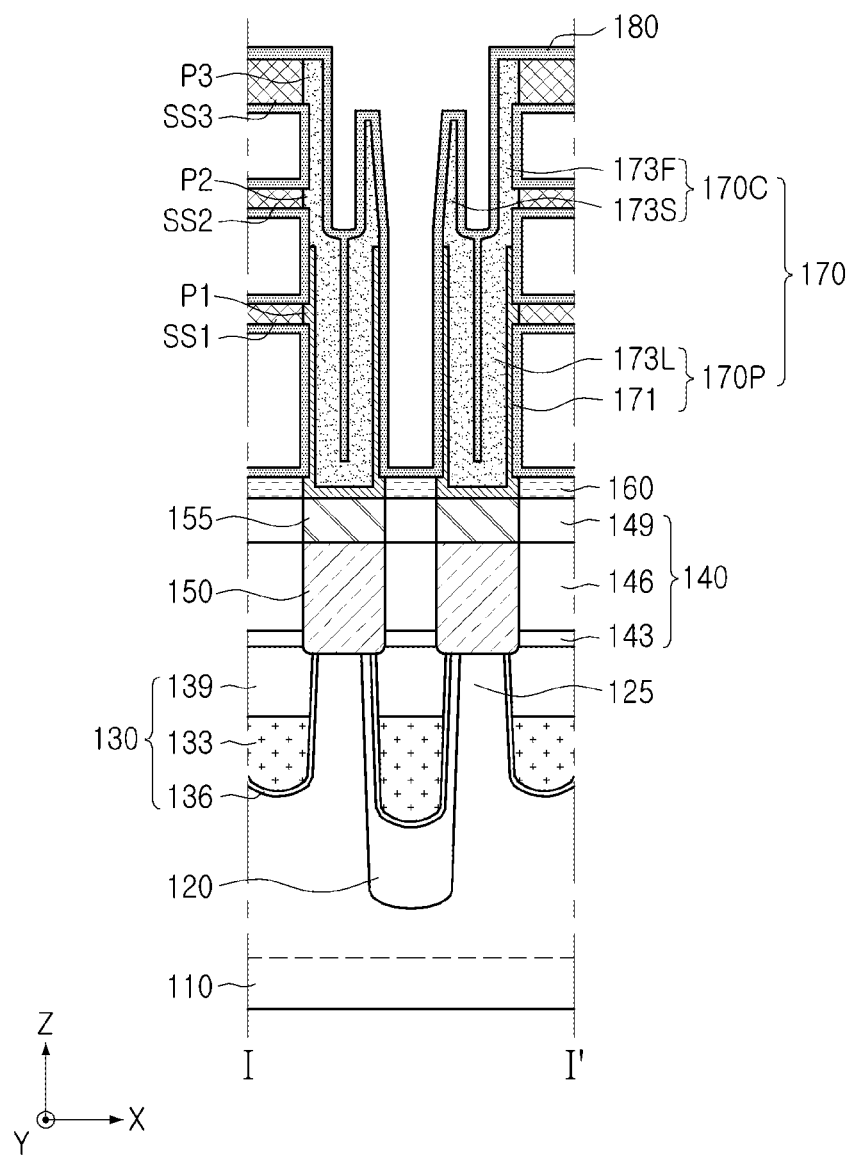
Figure 6N:
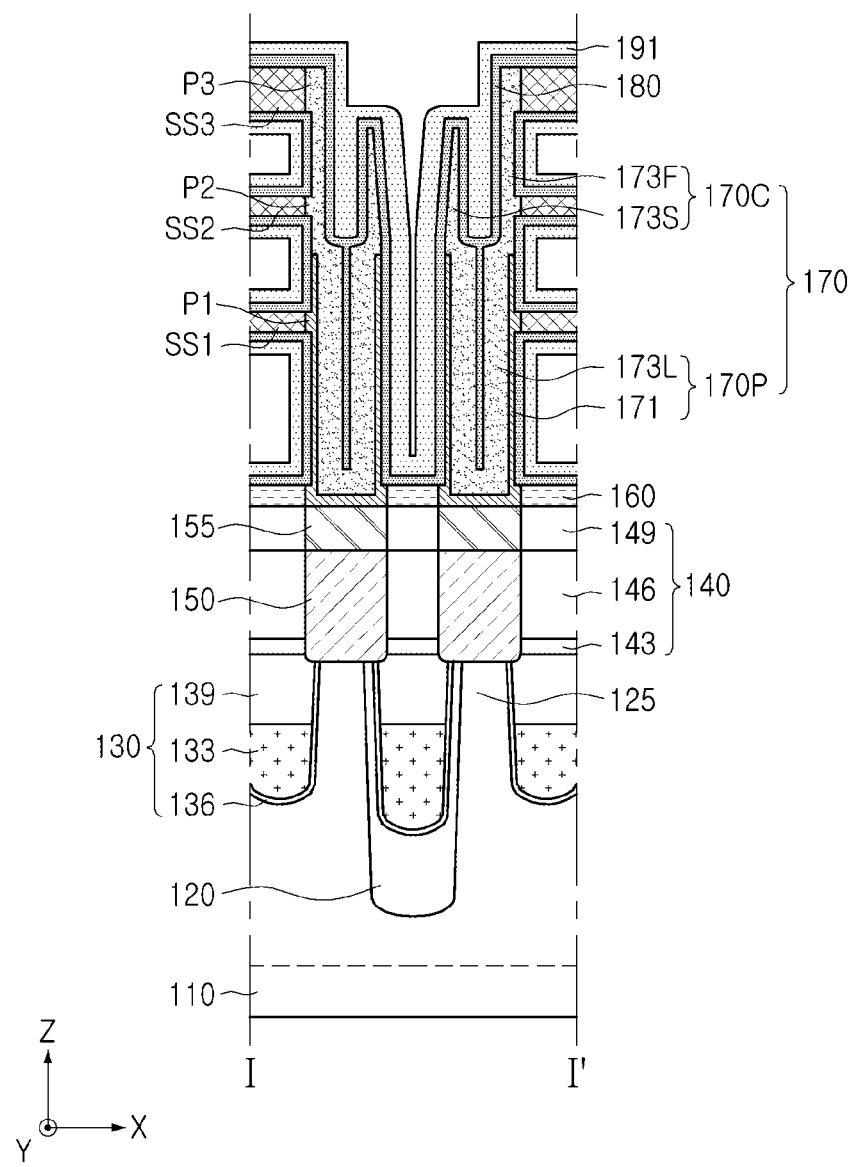

FIGS. 6A to 6N are schematic cross-sectional views of stages in a method of fabricating a semiconductor device according to example embodiments. FIGS. 6A to 6N illustrate cross-sections corresponding to the cross-section of FIG. 2.

Referring to FIG. 6A, a lower structure including the substrate 110 may be formed, and molding layers ML1, ML2, and ML3 and preliminary supporter layers SL1, SL2, and SL3 may be alternately stacked on the lower structure. Holes H may be formed to penetrate through the molding layers ML1, ML2, and ML3 and the preliminary supporter layers SL1, SL2, and SL3.

Active regions 125 and device isolation regions 120 (defining the active regions 125) may be formed on the substrate 110. A portion of the substrate 110 may be removed to form trenches extending (e.g., lengthwise) in a first direction (a Y-direction), and buried gate structures 130 may be formed in the trenches. Impurity regions may be formed on opposite sides adjacent to the buried gate structures 130, and bitline structures may be formed in a second direction (an X-direction) intersecting the first direction (the Y-direction).

First and second interlayer insulating layers 143 and 146 may be formed to cover the substrate 110. An opening may be formed through the first and second interlayer insulating layers 143 and 146 to expose a portion of the active region 125. The opening may be filled with a conductive material to form storage node contacts 150. In an implementation, the storage node contacts 150 may include, e.g., polycrystalline silicon (Si), titanium (Ti), titanium nitride (TiN), tantalum (Ta), tantalum nitride (TaN), tungsten (W), tungsten nitride (WN), or aluminum (Al).

A third interlayer insulating layer 149 may be formed to cover the second interlayer insulating layer 146 and the storage node contacts 150. An opening may be formed through the third interlayer insulating layer 149 to expose at least a portion of the storage node contacts 150. The opening may be filled with a conductive material to form landing pads 155. In an implementation, the landing pads 155 may include, e.g., doped polycrystalline silicon (Si).

An etch-stop layer 160 may be formed to cover the third interlayer insulating layer 149 and the landing pads 155. The etch-stop layer 160 may include an insulating material having etching selectivity with respect to the molding layers ML1, ML2, and ML3 under a specific etching condition. In an implementation, when the molding layers ML1, ML2, and ML3 include a silicon oxide, the etch-stop layer 160 may include, e.g., a silicon nitride (SiN) or a silicon carbonitride (SiCN).

The molding layers ML1, ML2, and ML3 and the preliminary supporter layers SL1, SL2, and SL3 may be alternately stacked on the etch-stop layer 160 to form a stack structure D. In an implementation, each of the molding layers ML1, ML2, ML3 and the preliminary supporter layers SL1, SL2, and SL3 may include three layers. The molding layers ML1, ML2, ML3 and the preliminary supporter layers SL1, SL2, and SL3 may have the same thickness or different thicknesses. In an implementation, the first molding layer ML1 may have a thickness (e.g., in the Z direction) that is greater than a thickness of the second molding layer ML2, and the second molding layer ML2 may have a thickness that is greater than a thickness of the third molding layer ML3. The third preliminary supporter layer SL3 may have a thickness that is greater than a thickness of each of the first and second preliminary supporter layers SL1 and SL2.

The holes H may be formed to penetrate through the stack structure D. The holes H may penetrate through the etch-stop layer 160 to expose the landing pad 155.

Referring to FIG. 6B, a first preliminary lower electrode layer 171' may be conformally formed in the holes H and on an upper surface of the stack structure D. The first preliminary lower electrode layer 171' may be formed to have a thickness that is smaller than a diameter of each of the holes H.

The first preliminary lower electrode layer 171' may be formed by a process such as chemical vapor deposition (CVD), atomic layer deposition (ALD), or the like. The first preliminary lower electrode layer 171' may include a conductive material. In an implementation, the first preliminary lower electrode layer 171' may include, e.g., polycrystalline silicon (Si), titanium (Ti), titanium nitride (TiN), tantalum (Ta), tantalum nitride (TaN), tungsten (W), or tungsten nitride (WN), or aluminum (Al).

Referring to FIG. 6C, a sacrificial layer OM may be formed on the upper surface of the first preliminary lower electrode layer 171'. The first preliminary lower electrode layer 171' may be formed to fill the holes H and to cover the stacked structure D.

The sacrificial layer OM may include an organic material. The organic material included in the sacrificial layer OM, may have a low viscosity and may be easily removed in a process to be described below. In an implementation, the sacrificial layer OM may include a bottom anti-reflection coating (BARC). In an implementation, the sacrificial layer OM may include a heat eliminable polymer (HELP). The HELP may be adsorbed in a device in a solid form at a temperature of 170 degrees Celsius or less, and may be removed by thermal decomposition in a gaseous form at a temperature of 170 degrees Celsius or more. When the sacrificial layer OM includes a HELP, a process of forming the sacrificial layer OM may be performed at a temperature of 170 degrees or less.

The sacrificial layer OM including an organic material may be formed on the first preliminary lower electrode layer 171' in the process of FIG. 6C to coat the inside of the hole H without a seam. If the hole H were to be filled with a conductive material such as a titanium nitride (TiN), a morphology of the conductive material may not be uniform, so that a seam could be formed in the hole H. If the conductive material were to be etched in such a state, a non-uniform distribution of recesses could occur. Therefore, a length of a single cylinder stack could vary for each of a plurality of capacitors, resulting in non-uniform capacitance.

In the process of FIG. 6C, the first preliminary lower electrode layer 171' may be conformally formed in the holes H, and the holes H may then be filled with a sacrificial layer OM including an organic material. Thus, the holes H may be filled without the seam.

Referring to FIG. 6D, portions of the sacrificial layer OM on the stack structure D may be removed. In an implementation, the sacrificial layer OM may be removed by a (e.g., wet) etching process using hydrogen gas ($H_2$) and nitrogen gas ($N_2$). In an implementation, the etching process may vary depending on the type of an organic material included in the sacrificial layer OM.

Referring to FIG. 6E, at least a portion of the sacrificial layer OM in the holes H may be removed. As a method of removing the sacrificial layer OM, the etching described above with reference to FIG. 6D may be applied.

A seam may not be formed in the sacrificial layer OM in the holes H, and the sacrificial layer OM may be etched to the same depth in each of the holes H. The sacrificial layers OM, respectively remaining in the plurality of holes H, may have the same height. In an implementation, the sacrificial layer OM may be etched to a depth between the first preliminary supporter layer SL1 and the second preliminary supporter layer SL2. In an implementation, when the sacrificial layer OM is etched to a depth between the etch-stop layer 160 and the first preliminary supporter layer SL1, the capacitor CPa illustrated in FIG. 3 may be formed.

Referring to FIG. 6F, at least a portion of the first preliminary lower electrode layer 171', on an upper surface of the stack structure D and in the holes H, may be etched.

The first preliminary lower electrode layer 171' may be etched to the same height as the sacrificial layer OM remaining in the holes H. The sacrificial layers OM, respectively remaining in the plurality of holes H, may have the same height, and the first preliminary lower electrode layers 171' in the plurality of holes H may also be etched to have the same height.

Referring to FIG. 6G, all (e.g., remaining portions) of the sacrificial layers OM in the holes H may be removed. In an implementation, a method of removing the sacrificial layer OM may include the etching described above with reference to FIG. 6D. In an implementation, when the sacrificial layer OM includes a HELP, the sacrificial layer OM may be removed by thermal decomposition at a temperature of 170 degrees Celsius or more.

A first preliminary lower electrode layer 171' having a cylindrical shape having a lower surface may be formed in each of the holes H. The first preliminary lower electrode layers 171', respectively formed in the holes H, may have the same height.

Referring to FIG. 6H, a second preliminary lower electrode layer 173' may be formed in each of the holes H and on the upper surface of the stack structure D.

A first portion 173L' of the second preliminary lower electrode layer 173' may be formed to cover the first preliminary lower electrode layer 171' in each of the holes H. The first portion 173L' may fill a portion or an entirety of a space defined by or within the first preliminary lower electrode layer 171'. The first preliminary lower electrode layer 171' and the first portion 173L' may form a pillar shape.

In an implementation, a seam may be formed between the first portions 173L'. In an implementation, an entire internal space of the first preliminary lower electrode layer 171' may be filled without a seam, depending on a size of the holes H, a thickness and a material of the second preliminary lower electrode layer 173', or the like. In this case, the capacitor CPb illustrated in FIG. 4 may be formed.

A second portion 173U' of the second preliminary lower electrode layer 173' may cover a side surface of the holes H on which the first preliminary lower electrode layer 171' is not formed (e.g., has been removed). The second portion 173U' may have a cylindrical shape.

The third portion 173T' of the second preliminary lower electrode layer 173' may be formed to cover the upper surface of the stack structure D.

The second preliminary lower electrode layer 173' may include a conductive material. In an implementation, the second preliminary lower electrode layer 173' may include, e.g., polycrystalline silicon (Si), titanium (Ti), titanium nitride (TiN), tantalum (Ta), tantalum nitride (TaN), tungsten (W), tungsten nitride (WN), or aluminum (Al).

Referring to FIG. 6I, the second preliminary lower electrode layer 173' may be etched to remove a third portion 173T'. In the holes H, the first preliminary lower electrode layer 171' and the first portion 173L' of and the second lower electrode layer 173' may have a pillar shape, and the second portion 173U' of the second lower electrode layer 173' may have a cylindrical shape.

Referring to FIG. 6J, a mask M may be formed on the stacked structure D. The mask M may serve as an etching mask used to etch the first to third molding layers ML1, ML2, and ML3. The mask M may define a region in which the lower electrode structure 170 of FIG. 2 is disposed. The mask M may have a structure including a hole-shaped openings.

Referring to FIG. 6K, by using the mask M as an etching mask, the molding layers ML1, ML2, and ML3 may be removed and portions of the preliminary supporter layers SL1, SL2, and SL3 may be removed.

An etching process may be performed on portions of the molding layers ML1, ML2, and ML3 and the preliminary supporter layers SL1, SL2, and SL3 which do not overlap the mask M in the Z direction. In an implementation, the third preliminary supporter layer SL3 may be etched by an anisotropic etching process, and the third molding layer ML3 may be removed by an isotropic etching process before the second preliminary supporter layer SL2 is etched. Similarly, the second preliminary supporter layer SL2 may be etched by an anisotropic etching process, and the second molding layer ML2 may be removed by an isotropic etching process before the first preliminary supporter layer SL1 is etched. After the first preliminary supporter layer SL1 is etched by an anisotropic etching process, the first molding layer ML1 may be removed by an isotropic etching process. The mask M may be removed after etching the molding layers ML1, ML2, and ML3 or while etching the molding layers ML1, ML2, and ML3.

Referring to FIG. 6L, an etching process may be performed to reduce the thickness of the preliminary lower electrode structure 170' to form a lower electrode structure 170.

An etching process of FIG. 6L may be performed to increase a gap between the adjacent lower electrode structures 170. Accordingly, occurrence of a short-circuit between the lower electrode structures 170 may be prevented. The lower electrode structure 170 may have a shape, similar to the shape of the preliminary lower electrode structure 170', except that a thickness thereof is decreased.

Portions of the preliminary lower electrode structures, adjacent to the preliminary supporter layers SL1, SL2, and SL3 of FIG. 6K, may remain without being etched. The remaining portions of the preliminary supporter layers (SL1, SL2, and SL3 of FIG. 6K) may be defined as first to third supporter layers SS1, SS3, and SS3. The first to third supporter layers SS1, SS2, and SS3 may be on side surfaces of the lower electrode structures 170 to connect lower electrode structures adjacent to each other, among the lower electrode structures 170.

The portions of the lower electrode structure 170, adjacent to the first to third supporter layers SS1, SS2, and SS3, may remain without being etched. As a result, projections P1, P2, and P3 may be formed to protrude (e.g., outwardly) from the lower electrode structure 170 toward the first to third supporter layers SS1, SS2, and SS3. In an implementation, the first projection P1 may protrude from the first lower electrode layer 171 to be in contact (e.g., direct contact) with the first supporter layer SS1. The second projection P2 may protrude from the first sidewall portion 173F of the second lower electrode layer 173 to be in contact (e.g., direct contact) with the second supporter layer SS2. The third projection P3 may protrude from the first sidewall portion 173F of the second lower electrode layer 173 to be in contact (e.g., direct contact) with the third supporter layer SS3.

Referring to FIG. 6M, a dielectric layer 180 may be formed to cover the plurality of lower electrode structures 170 and the first to third supporter layers SS1, SS2, and SS3 connected to the plurality of lower electrode structures 170.

The dielectric layer 180 may conformally cover upper surfaces and side surfaces of the plurality of lower electrode structures 170, an upper surface of the etch-stop layer 160, and exposed surfaces of the first to third supporter layers SS1, SS2, and SS3. When a seam is formed in the first portion 173L of the second lower electrode layer 173, the dielectric layer 180 may extend to also fill the seam. The dielectric layer 180 may include, e.g., a high-k dielectric material, a silicon oxide, a silicon nitride, a silicon oxynitride, or combinations thereof.

Referring to FIG. 6N, a first upper electrode layer 191 may be formed on the dielectric layer 180. The first upper electrode layer 191 may conformally cover the dielectric layer 180. The first upper electrode layer 191 may include, e.g., a titanium nitride (TiN).

Returning to FIG. 2, a second upper electrode layer 192 may be formed on the first upper electrode layer 191.

The second upper electrode layer 192 may fill a space between the plurality of lower electrode structures 170, and may cover the plurality of lower electrode structures 170 and the first to third supporter layers SS1, SS2, and SS3.

The second upper electrode layer 192 may include a semiconductor material, e.g., polycrystalline silicon (Si) containing impurities. The second upper electrode layer 192 may constitute the upper electrode structure 190 together with the first upper electrode layer 191.

The lower electrode structure 170 of the capacitor CP according to example embodiments may be formed by adsorbing or depositing lower electrode layers twice (e.g., two separate deposition or formation processes). When the lower electrode structure 170 of the capacitor CP is analyzed using a transmission electron microscopy (TEM), the first and second lower electrode layers 171 and 173 may be identified.

In an implementation, in the pillar portion 170P of the lower electrode structure 170, a first lower electrode layer 171 having a cylindrical shape having a lower surface and a side surface and a first portion 173L of a second lower electrode layer 173 filling an internal space of the first lower electrode layer 171 may be provided. The first portion 173L of the lower electrode layer 173 may be identified. Sidewall portions 173F and 173S, extending from the first portion 173L of the second lower electrode layer 173, may be identified in the cylinder portion 170C of the lower electrode structure 170.

Figure 7:
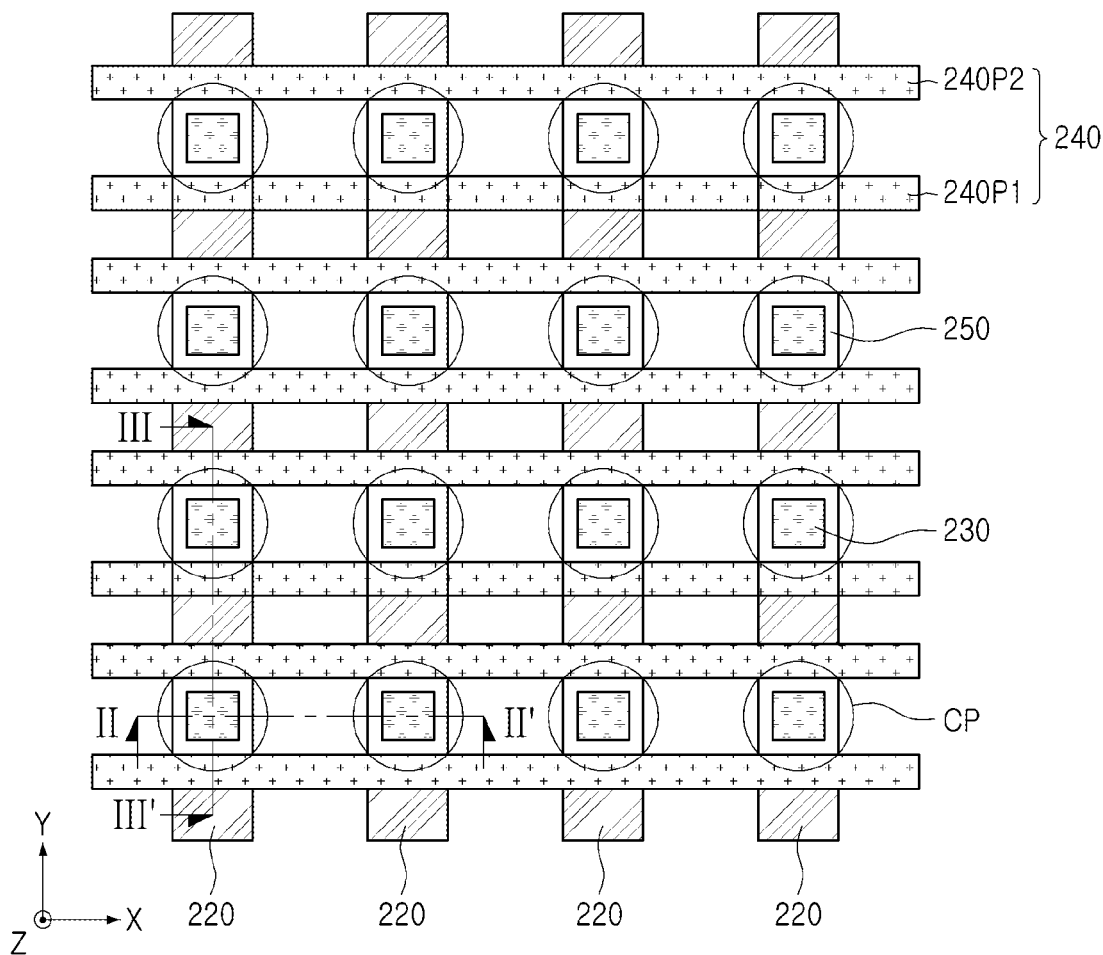
FIG. 7 is a schematic layout diagram of a semiconductor device according to example embodiments.
Figure 8:
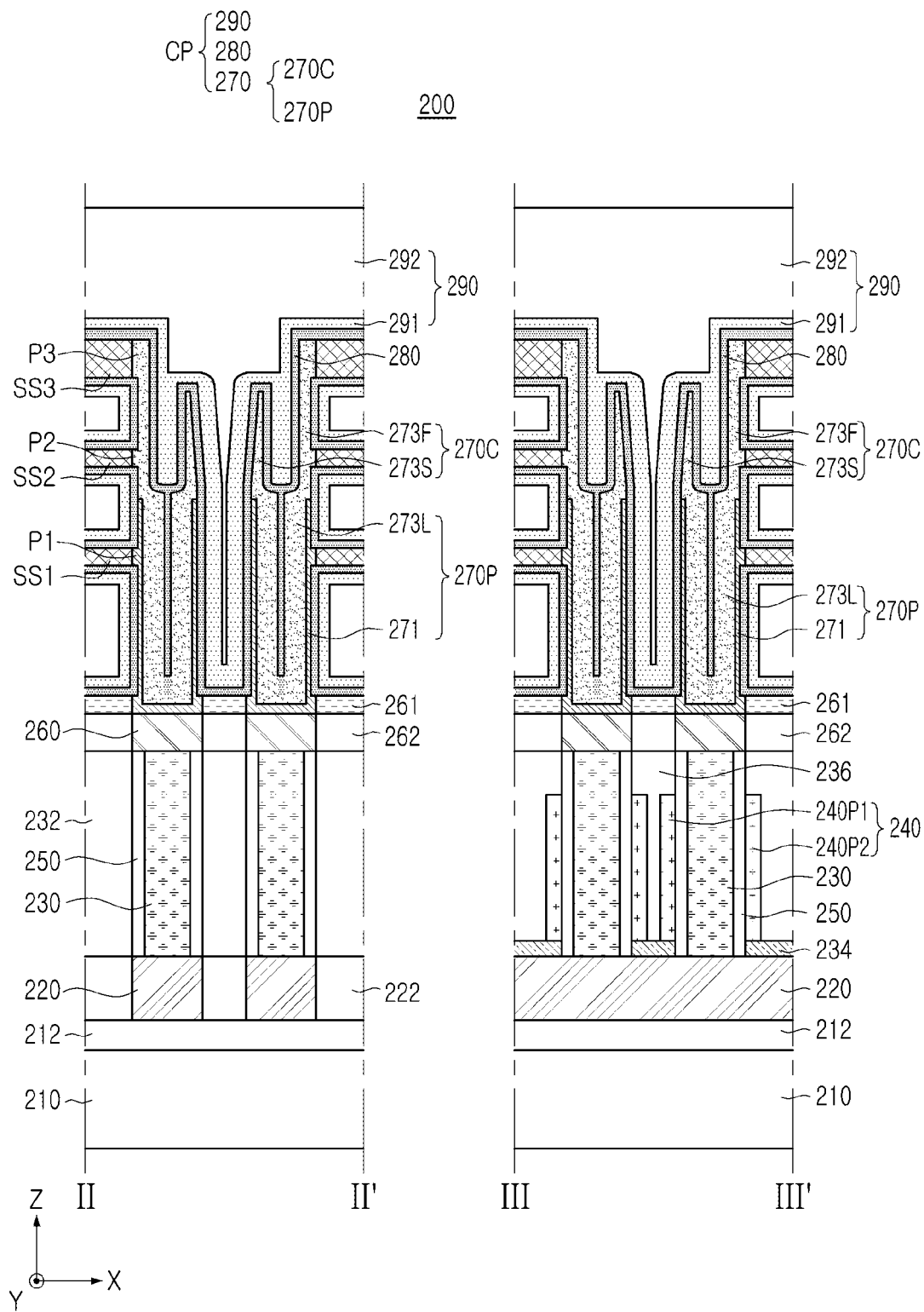
FIG. 8 is a schematic cross-sectional view of a semiconductor device according to example embodiment.

FIGS. 7 and 8 illustrate a semiconductor device 200 according to example embodiments.

FIG. 7 is a layout diagram of the semiconductor device 200 according to example embodiments. FIG. 8 is a cross-sectional view of a semiconductor device according to example embodiments. FIG. 8 is a cross-sectional view taken along lines II-II' and III-III' of FIG. 7.

Referring to FIGS. 7 and 8, the semiconductor device 200 may include a substrate 210, a plurality of first conductive lines 220, a channel layer 230, a gate electrode layer 240, a gate insulating layer 250, and a capacitor CP. The semiconductor device 200 may be a memory device including a vertical channel transistor (VCT). The vertical channel transistor may refer to a structure in which a channel length of the channel layer 230 is increased from the substrate 210 in a vertical direction.

A lower insulating layer 212 may be on the substrate 210, and a plurality of first conductive lines 220 may be spaced apart from each other in the X-direction and may extend (e.g., lengthwise) in the Y-direction on the lower insulating layer 212. A plurality of first insulating patterns 222 may be on the lower insulating layer 212 to fill a space between the plurality of first conductive lines 220. The plurality of first insulating patterns 222 may extend in the Y-direction, and upper surfaces of the plurality of first insulating patterns 222 may be at the same level as upper surfaces of the plurality of first conductive lines 220. The plurality of first conductive lines 220 may function as bitlines of the semiconductor device 200.

In an implementation, the plurality of first conductive lines 220 may include doped polycrystalline silicon, a metal, a conductive metal nitride, a conductive metal silicide, a conductive metal oxide, or a combination thereof. In an implementation, the plurality of first conductive lines 220 may be formed of, e.g., doped polycrystalline silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof. The plurality of first conductive lines 220 may include a single layer or multiple layers of the above-mentioned materials. In an implementation, the plurality of first conductive lines 220 may include a two-dimensional semiconductor material. In an implementation, the two-dimensional semiconductor material may include, e.g., graphene, carbon nanotubes, or a combination thereof.

The channel layer 230 may be arranged in a matrix form spaced apart in the X-direction and the Y-directions on the plurality of first conductive lines 220. The channel layer 230 may have a first width in the X-direction and a first height in the Z-direction, and the first height may be greater than the first width. In an implementation, the first height may be, e.g., about 2 to 10 times the first width. A bottom portion of the channel layer 230 may serve as a first source/drain region, an upper portion of the channel layer 230 may serve as a second source/drain region, and a portion of the channel layer 230 between the first and second source/drain regions may serve as a channel region.

In an implementation, the channel layer 230 may include an oxide semiconductor. In an implementation, the oxide semiconductor may include, e.g., $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_zO$, $Hf_xInn$, $Al_xZn_ySn_zO$, $Yb_xGa_yZn_zO$, $In_xGa_yO$, or combinations thereof. The channel layer 230 may include a single layer or multiple layers of an oxide semiconductor. In an implementation, the channel layer 230 may have bandgap energy, greater than bandgap energy of silicon. In an implementation, the channel layer 230 may have bandgap energy of about 1.5 eV to about 5.6 eV. In an implementation, the channel layer 230 may have optimal channel performance when having bandgap energy of about 2.0 eV to 4.0 eV. In an implementation, the channel layer 230 may be polycrystalline or amorphous. In an implementation, the channel layer 230 may include a two-dimensional semiconductor material. In an implementation, the two-dimensional semiconductor material may include, e.g., graphene, carbon nanotubes, or a combination thereof.

The gate electrode layer 240 may extend in the X-direction on opposite sidewalls of the channel layer 230. The gate electrode layer 240 may include a first sub-gate electrode 240P1, facing a first sidewall of the channel layer 230, and a second sub-gate electrode 240P2 facing a second sidewall opposing the first sidewall of the channel layer 230. A single channel layer 230 may be between the first sub-gate electrode 240P1 and the second sub-gate electrode 240P2, and the semiconductor device 200 may have a dual-gate transistor structure. In an implementation, a single-gate transistor structure may be implemented by omitting the second sub-gate electrode 240P2 and forming only the first sub-gate electrode 240P1 facing the first sidewall of the channel layer 230.

The gate electrode layer 240 may include, e.g., doped polycrystalline silicon, a metal, a conductive metal nitride, a conductive metal silicide, a conductive metal oxide, or combinations thereof. In an implementation, the gate electrode layer 240 may be formed of, e.g., doped polycrystalline silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof.

The gate insulating layer 250 may surround a sidewall of the channel layer 230, and may be between the channel layer 230 and the gate electrode layer 240. In an implementation, an entire sidewall of the channel layer 230 may be surrounded by the gate insulating layer 250 and a portion of the sidewall of the gate electrode layer 240 may be in contact with the gate insulating layer 250, as illustrated in FIG. 7. In an implementation, the gate insulating layer 250 may extend in a direction in which the gate electrode layer 240 extends (e.g., the first or X direction), and among sidewalls of the channel layer 230, only two sidewalls facing the gate electrode layer 240 may be in contact with the gate insulating layer 250.

In an implementation, the gate insulating layer 250 may include a silicon oxide layer, a silicon oxynitride layer, a high-k dielectric layer having a dielectric constant higher than a dielectric constant of the silicon oxide layer, or combinations thereof. The high-k dielectric layer may be formed of a metal oxide or a metal oxynitride. In an implementation, a high-k dielectric layer, available as the gate insulating layer 250, may be formed of, e.g., $HfO_2$, HfSiO, HfSiON, HfTaO, HfTiO, HfZrO, $ZrO_2$, $Al_2O_3$, or combinations thereof.

A plurality of second insulating patterns 232 may extend in the second or Y direction on a plurality of first insulating patterns 222, and a channel layer 230 may be between two adjacent second insulating patterns 232, among the plurality of second insulating patterns 232. In an implementation, a first buried layer 234 and a second buried layer 236 may be in a space between two adjacent channel layers 230, between two adjacent second insulating patterns 232. The first buried layer 234 may be in a bottom portion of the space between the two adjacent channel layers 230, and the second buried layer 236 may be formed to fill the other portion of the space between the two adjacent channel layers 230 on the first buried layer 234. An upper surface of the second buried layer 236 may be on the same level as an upper surface of the channel layer 230, and the second buried layer 236 may cover the upper surface of the gate electrode layer 240. In an implementation, the plurality of second insulating patterns 232 may be formed of a material layer, continuous to the plurality of first insulating patterns 222, or the second buried layer 236 may be formed of a material, continuous to the first buried layer 234.

A storage node contact 260 may be on the channel layer 230. The storage node contacts 260 may vertically overlap the channel layer 230 and may be in a matrix form spaced apart in the X-direction and the Y-direction. In an implementation, the storage node contact 260 may be formed of, e.g., doped polycrystalline silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or combinations thereof. The upper insulating layer 262 may surround sidewalls of the storage node contact 260 on the plurality of second insulating patterns 232 and the second buried layer 236.

An etch-stop layer 261 may be on the upper insulating layer 262, and a capacitor CP may be on the etch-stop layer 261. The capacitor CP may include a lower electrode structure 170, a dielectric layer 280, and an upper electrode structure 290. In an implementation, the capacitor CP may have a structure the same as or similar to the structures described with reference to FIGS. 1 to 5.

By way of summation and review, research into various structures has been considered to increase an effective surface area of a lower electrode of a capacitor which may store information in a dynamic random-access memory (DRAM).

As described above, a conductive material for a lower electrode structure of a capacitor may be deposited twice (e.g., in two separate processes) to allow lengths of a lower pillar stack and an upper single cylinder stack to be constant for each capacitor. Accordingly, a semiconductor device having constant capacitance for each capacitor may be provided.

One or more embodiments may provide a highly integrated semiconductor device having improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
storage node contacts on the substrate;
lower electrode structures on the storage node contacts;
a supporter structure on at least a portion of an external side surface of the lower electrode structures and connecting adjacent lower electrode structures to each other;
a dielectric layer on the lower electrode structures and the supporter structure; and
an upper electrode structure on the dielectric layer, wherein:
each of the lower electrode structures includes: a pillar portion in contact with each of the storage node contacts; and
a cylinder portion on the pillar portion, the pillar portion includes:
a first lower electrode layer having a cylindrical shape and having a lower surface and a side surface; and
a first portion covering at least an internal wall of the first lower electrode layer, and the cylinder portion includes
a second portion extending from the first portion and covering an upper end of the first lower electrode layer, and
wherein a portion of the dielectric layer extends away from the upper electrode structure through the cylinder portion into the pillar portion;
wherein the upper electrode structure comprises a first upper electrode structure and a second upper electrode structure, wherein a portion of the second upper electrode structure that does not vertically overlap the lower electrode structures extends towards the substrate between the pillar portion of the adjacent lower electrode structures is centered between the pillar portion of the adjacent lower electrode structures.

2. The semiconductor device as claimed in claim 1, wherein the cylinder portion of each of the lower electrode structures have a same height.

3. The semiconductor device as claimed in claim 1, wherein the second portion includes a side surface aligned with at least a portion of the side surface of the first lower electrode layer.

4. The semiconductor device as claimed in claim 1, wherein:
the second portion of the cylinder portion includes a first sidewall and a second sidewall, and
at least a portion of the supporter structure is in contact with the first sidewall.

5. The semiconductor device as claimed in claim 4, wherein the first sidewall has a height that is greater than a height of the second sidewall.

6. The semiconductor device as claimed in claim 1, wherein the supporter structure includes a first supporter layer, a second supporter layer, and a third supporter layer sequentially spaced apart from an upper surface of the substrate.

7. The semiconductor device as claimed in claim 6, wherein the upper end of the first lower electrode layer is at a level between the first supporter layer and the second supporter layer.

8. The semiconductor device as claimed in claim 1, wherein each of the lower electrode structures includes projections protruding toward the supporter structure.

9. The semiconductor device as claimed in claim 1, wherein the substrate includes:
active regions defined by a device isolation region; and
buried gate structures extending in a first direction while intersecting the active regions and spaced apart from each other in a second direction, intersecting the first direction.

10. The semiconductor device as claimed in claim 9, wherein the storage node contacts are in contact with at least a portion of active regions between the buried gate structures.

11. A semiconductor device, comprising:
a lower electrode structure including a pillar portion and a cylinder portion on the pillar portion and extending from the pillar portion;
a dielectric layer on the lower electrode structure; and
an upper electrode structure on the dielectric layer,
wherein the pillar portion includes a first lower electrode layer and a second lower electrode layer on the first lower electrode layer, and
wherein a portion of the dielectric layer extends away from the upper electrode structure through the cylinder portion of the lower electrode structure into the pillar portion of the lower electrode structure;

wherein the upper electrode structure comprises a first upper electrode structure and a second upper electrode structure, wherein a portion of the second upper electrode structure that does not vertically overlap the lower electrode structures extends vertically to the pillar portion of the lower electrode structures and a portion of the second upper electrode structure that vertically overlaps the lower electrode structures does not extend to the pillar portion in a vertical direction.

12. The semiconductor device as claimed in claim 11, wherein the cylinder portion extends from the second lower electrode layer of the pillar portion.

13. The semiconductor device as claimed in claim 11, wherein:
the first lower electrode layer of the pillar portion has a cylindrical shape having a closed lower surface, and
the second lower electrode layer includes a portion covering an inner wall of a space defined by the cylindrical shape of the first lower electrode layer.

14. The semiconductor device as claimed in claim 11, wherein the cylinder portion covers an upper end of the first lower electrode layer.

15. A semiconductor device, comprising:
a substrate;
storage node contacts on the substrate; and
capacitors respectively on the storage node contacts, wherein:
each of the capacitors includes:
lower electrode structures including a pillar portion in contact with each of the storage node contacts and a cylinder portion on the pillar portion;
a dielectric layer on the lower electrode structures; and
an upper electrode structure on the dielectric layer, and
wherein the pillar portion includes a first lower electrode layer having a cylindrical shape and a second lower electrode layer covering an inner wall of the first lower electrode layer, and
wherein a portion of the dielectric layer extends away from the upper electrode structure through the cylinder portion into the second lower electrode layer of the pillar portion;
wherein the upper electrode structure comprises a first upper electrode structure and a second upper electrode structure, wherein a portion of the second upper electrode structure that does not vertically overlap the lower electrode structures extends towards the substrate between the pillar portion of the adjacent lower electrode structures is centered between the pillar portion of the adjacent lower electrode structures.

16. The semiconductor device as claimed in claim 15, wherein the cylinder portion extends from the second lower electrode layer of the pillar portion.

17. The semiconductor device as claimed in claim 15, further comprising supporter layers spaced apart from an upper surface of the substrate,
wherein the supporter layers include:
a first supporter layer in contact with an external side surface of the pillar portion; and
a second supporter layer in contact with an external side surface of the cylinder portion.

18. The semiconductor device as claimed in claim 17, wherein:
the cylinder portion includes a portion extending from the second lower electrode layer of the pillar portion,
the first supporter layer is in contact with the first lower electrode layer, and
the second supporter layer is in contact with the portion of the cylinder portion extending from the second lower electrode layer of the pillar portion.

* * * * *